(12) United States Patent
Lee et al.

(10) Patent No.: US 12,490,470 B2
(45) Date of Patent: Dec. 2, 2025

(54) THIN-FILM TRANSISTOR, THIN-FILM TRANSISTOR ARRAY SUBSTRATE, AND METHOD FOR MANUFACTURING THIN-FILM TRANSISTOR

(71) Applicant: Samsung Display Co., LTD., Yongin-si (KR)

(72) Inventors: Kyoung Won Lee, Seoul (KR); Eun Hye Ko, Yongin-si (KR); Yeon Hong Kim, Hwaseong-si (KR); Eun Hyun Kim, Suwon-si (KR); Hyung Jun Kim, Seoul (KR); Sun Hee Lee, Seoul (KR); Jun Hyung Lim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 650 days.

(21) Appl. No.: 17/870,805

(22) Filed: Jul. 21, 2022

(65) Prior Publication Data
US 2023/0163217 A1    May 25, 2023

(30) Foreign Application Priority Data

Nov. 19, 2021  (KR) .................. 10-2021-0160600

(51) Int. Cl.
*H10D 30/67*  (2025.01)
*H10D 86/40*  (2025.01)
(Continued)

(52) U.S. Cl.
CPC ........ *H10D 30/6755* (2025.01); *H10D 86/411* (2025.01); *H10D 86/423* (2025.01); *H10D 86/60* (2025.01); *H10D 99/00* (2025.01)

(58) Field of Classification Search
CPC ............ H10D 30/6755; H10D 86/411; H10D 86/423; H10D 86/60; H10D 99/00;
(Continued)

(56) References Cited

U.S. PATENT DOCUMENTS 10,096,684 B2   10/2018   Hosaka et al.
10,535,742 B2    1/2020   Hosaka et al.
(Continued)

FOREIGN PATENT DOCUMENTS

CN    104659107 A  *  5/2015  .......... H01L 21/324
CN    108039351         5/2018
(Continued)

OTHER PUBLICATIONS

English tranlation of KR2021/0085643 (Year: 2021).*
(Continued)

*Primary Examiner* — William B Partridge
*Assistant Examiner* — David Paul Sedorook
(74) *Attorney, Agent, or Firm* — CANTOR COLBURN LLP

(57) ABSTRACT

A thin-film transistor includes a light-shielding layer disposed on a substrate, an oxygen supply layer disposed on the light-shielding layer and including a metal oxide, a buffer layer disposed on the substrate and covering the oxygen supply layer, an active layer disposed on the buffer layer, where the active layer includes a channel area overlapping the light-shielding layer, and a first electrode area and a second electrode area respectively in contact with opposing sides of the channel area, a gate insulating layer disposed on the channel area of the active layer.

21 Claims, 44 Drawing Sheets

(51) Int. Cl.
  *H10D 86/60*   (2025.01)
  *H10D 99/00*   (2025.01)

(58) Field of Classification Search
  CPC ........... H10D 30/6734; H10D 30/6723; H10D 86/481; H10D 86/441; H10D 86/451; H10D 30/6704; H10K 59/126; H01L 29/7869; H01L 29/78648; H01L 29/78633; H01L 29/78606; H01L 29/66969; H01L 27/1255; H01L 27/124; H01L 27/1248; H01L 27/1225; H01L 27/1218
  See application file for complete search history.

(56) References Cited

U.S. PATENT DOCUMENTS

| | | | |
|---|---|---|---|
| 11,063,125 B2 | 7/2021 | Hosaka et al. | |
| 11,469,283 B2 | 10/2022 | Kim et al. | |
| 11,757,007 B2 | 9/2023 | Hosaka et al. | |
| 12,087,825 B2 | 9/2024 | Hosaka et al. | |
| 2001/0038485 A1* | 11/2001 | Hirabayashi | G02F 1/136209 |
| | | | 359/248 |
| 2002/0153569 A1* | 10/2002 | Katayama | H10D 30/6723 |
| | | | 438/30 |
| 2013/0299816 A1* | 11/2013 | Bessho | H10H 20/8515 |
| | | | 257/40 |
| 2018/0286888 A1* | 10/2018 | Yamaguchi | H10D 86/60 |
| 2021/0408186 A1* | 12/2021 | Li | H10K 71/00 |

FOREIGN PATENT DOCUMENTS

| | | | | |
|---|---|---|---|---|
| JP | 2003187975 A | * | 7/2003 | ......... H01L 51/5253 |
| KR | 20180099725 A | | 9/2018 | |
| KR | 1020210010696 | | 1/2021 | |
| KR | 20210085643 A | * | 7/2021 | ......... H10D 30/6755 |
| KR | 1020210085643 | | 7/2021 | |
| KR | 20210129294 A | | 10/2021 | |

OTHER PUBLICATIONS

English translation of JP 2003/187975 (Year: 2003).*
English translation of CN 104659107 (Year: 2015).*
Rongsheng Chen, et al., "Self-aligned top-gate InGaZnO thin film transistors using SiO2/Al2O3 stack gate dielectric", Thin Solid Films, vol. 548, (2013), pp. 572-575.

* cited by examiner

THIN-FILM TRANSISTOR, THIN-FILM TRANSISTOR ARRAY SUBSTRATE, AND METHOD FOR MANUFACTURING THIN-FILM TRANSISTOR This application claims priority to Korean Patent Application No. 10-2021-0160600, filed on Nov. 19, 2021, and all the benefits accruing therefrom under 35 U.S.C. § 119, the content of which in its entirety is herein incorporated by reference.

BACKGROUND

1. Field

Embodiments of the disclosure relate to a thin-film transistor, a thin-film transistor array substrate, and a method for manufacturing a thin-film transistor.

2. Description of Related Art

As information society develops, demand for a display device to display an image is increasing in various fields. For example, the display device is applied to various electronic devices such as a smart phone, a digital camera, a notebook computer, a navigation system, and a smart television.

The display device may include a display panel that emits light for image display and a driver that supplies signals and voltages to drive the display panel.

The display panel may include a pair of substrates opposite to each other, and a polarizing member or a light-emitting member disposed between the pair of substrates.

One of the pair of substrates included in the display panel may be a thin-film transistor array substrate including a plurality of thin-film transistors for individually driving a plurality of pixel areas arranged in a display area for implementing image display.

SUMMARY

In an display panel, a thin-film transistor array substrate may include a plurality of thin-film transistors as switching elements that are turned on based on a drive signal of a voltage greater than or equal to a threshold voltage. However, when the plurality of thin-film transistors have different threshold voltage characteristics, luminance characteristics of the plurality of pixel areas are different from each other. Thus, display quality of the display panel may be deteriorated.

Embodiments of the disclosure provide a thin-film transistor capable of adjusting threshold voltage characteristic thereof, a thin-film transistor array substrate including the thin-film transistor, and a method for manufacturing the thin-film transistor.

According to an embodiment, a thin-film transistor includes a light-shielding layer disposed on a substrate, an oxygen supply layer disposed on the light-shielding layer, where the oxygen supply layer includes a metal oxide, a buffer layer disposed on the substrate and covering the oxygen supply layer, an active layer disposed on the buffer layer, where the active layer includes a channel area overlapping the light-shielding layer, and a first electrode area and a second electrode area respectively in contact with opposing sides of the channel area, a gate insulating layer disposed on the channel area of the active layer, a gate electrode disposed on the gate insulating layer, an interlayer insulating layer disposed on the buffer layer and covering the active layer and the gate electrode, where a first electrode hole is defined through the interlayer insulating layer to overlap a portion of the first electrode area of the active layer, and a first electrode disposed on the interlayer insulating layer and connected to the first electrode area of the active layer via the first electrode hole.

In an embodiment, a contact hole may be defined through the interlayer insulating layer and the buffer layer to overlap a portion of the oxygen supply layer. In such an embodiment, the light-shielding layer may be connected to one of the gate electrode and the first electrode via the contact hole and the oxygen supply layer.

In an embodiment, a portion of the oxygen supply layer corresponding to the contact hole may have a first thickness, and another portion of the oxygen supply layer may have a second thickness smaller than the first thickness.

In an embodiment, the buffer layer may be disposed directly on the substrate and have a planarized top surface. In such an embodiment, a portion of the buffer layer in contact with the substrate may have a third thickness, and the third thickness of the portion of the buffer layer may exceed a sum of the first thickness of the portion of the oxygen supply layer and a thickness of the light-shielding layer.

In an embodiment, a difference between a depth of the first electrode hole and a depth of the contact hole may be about 300 angstrom (Å) or smaller.

In an embodiment, the metal oxide may include at least one selected from indium (In), gallium (Ga), zinc (Zn), tin (Sn), titanium (Ti), zirconium (Zr), and hafnium (Hf).

In an embodiment, the active layer may include an oxide semiconductor including at least one selected from indium (In), gallium (Ga), zinc (Zn), tin (Sn), titanium (Ti), zirconium (Zr), and hafnium (Hf).

In an embodiment, each of the active layer and the oxygen supply layer may include indium-gallium-zinc-oxide ("IGZO").

In an embodiment, the thin-film transistor may further include an auxiliary oxygen supply layer disposed between the gate insulating layer and the gate electrode, where auxiliary oxygen supply layer may include the metal oxide.

In an embodiment, the thin-film transistor may further include a second electrode disposed on the interlayer insulating layer and connected to the second electrode area of the active layer via a second electrode hole defined through the interlayer insulating layer to overlap a portion of the second electrode area of the active layer.

According to an embodiment, a thin-film transistor array substrate includes a substrate including a display area in which a plurality of pixel areas are defined, a scan line disposed in the display area and on the substrate, and extending in a first direction, and a data line disposed in the display area and on the substrate, and extending in a second direction. In such an embodiment, each of the plurality of pixel areas includes a first thin-film transistor disposed between a first drive power line and a pixel electrode, and a second thin-film transistor disposed between a gate electrode of the first thin-film transistor and the data line, and connected to the scan line. In such an embodiment, at least one selected from the first and second thin-film transistors includes a light-shielding layer disposed on the substrate, an oxygen supply layer disposed on the light-shielding layer, an active layer disposed on a buffer layer covering the oxygen supply layer, where the active layer includes a channel area overlapping the light-shielding layer, and first and second electrode areas respectively in contact with opposing sides of the channel area, a gate insulating layer disposed on the channel area of the active layer, a gate electrode disposed on the gate insulating layer, and a first electrode disposed on an interlayer insulating layer covering the active layer and the gate electrode, where the first electrode is connected to the first electrode area of the active layer via a first electrode hole defined through the interlayer insulating layer.

In an embodiment, the oxygen supply layer may include a metal oxide including at least one selected from indium (In), gallium (Ga), zinc (Zn), tin (Sn), titanium (Ti), zirconium (Zr), and hafnium (Hf).

In an embodiment, The active layer may include an oxide semiconductor including at least one selected from indium (In), gallium (Ga), zinc (Zn), tin (Sn), titanium (Ti), zirconium (Zr), and hafnium (Hf).

In an embodiment, the light-shielding layer may be connected to one of the gate electrode and the first electrode via a contact hole defined through the interlayer insulating layer and the buffer layer to overlap a portion of the oxygen supply layer.

In an embodiment, the second electrode area of the active layer of the first thin-film transistor may be connected to the first drive power line, and the first electrode of the first thin-film transistor may be connected to the light-shielding layer via the contact hole.

In an embodiment, the second thin-film transistor may further include a second electrode disposed on the interlayer insulating layer and connected to the second electrode area of the active layer via a second electrode hole defined through the interlayer insulating layer to overlap a portion of the second electrode area of the active layer. In such an embodiment, a third electrode hole may be defined through the interlayer insulating layer to overlap a portion of the gate electrode. In such an embodiment, the first electrode of the second thin-film transistor may be connected to the data line, and the second electrode of the second thin-film transistor may be connected to the gate electrode of the first thin-film transistor via the third electrode hole of the first thin-film transistor.

In an embodiment, a third electrode hole may be defined through the interlayer insulating layer to overlap a portion of the gate electrode, and a connective pattern may be disposed on the interlayer insulating layer and connects the contact hole and the third electrode hole to each other. In such an embodiment, the gate electrode of the second thin-film transistor may be connected to the light-shielding layer of the second thin-film transistor via the third electrode hole, the contact hole, and the connective pattern.

In an embodiment, a portion of the oxygen supply layer corresponding to the contact hole may have a first thickness, and another portion of the oxygen supply layer may have a second thickness smaller than the first thickness.

In an embodiment, a portion of the buffer layer in contact with the substrate has a third thickness. In such an embodiment, the third thickness of the portion of the buffer layer may exceed a sum of the first thickness of the portion of the oxygen supply layer and a thickness of the light-shielding layer.

In an embodiment, a difference between a depth of the first electrode hole and a depth of the contact hole may be about 300 Å or smaller.

In an embodiment, at least one selected from the first and second thin-film transistors may further include an auxiliary oxygen supply layer disposed between the gate insulating layer and the gate electrode, where the auxiliary oxygen supply may include a metal oxide.

According to an embodiment, a method for manufacturing a thin-film transistor, includes sequentially providing a light-shielding conductive material film and a metal oxide material film on a substrate, providing an oxygen supply layer by patterning the metal oxide material film while a photoresist mask layer is disposed on the metal oxide material film, providing a light-shielding layer by patterning the light-shielding conductive material film while maintaining the photoresist mask layer, removing the photoresist mask layer, providing a buffer layer which covers the oxygen supply layer, on the substrate, providing an active layer by patterning a semiconductor material film on the buffer layer, wherein the active layer includes a channel area overlapping the light-shielding layer, and a first electrode area and a second electrode area respectively in contact with both opposing sides of the channel area, providing a gate insulating layer and a gate electrode which are stacked sequentially with each other, by patterning an insulating material film covering the active layer and a first conductive material film on the insulating material film, where the gate electrode overlaps the channel area of the active layer, providing an interlayer insulating layer which covers the active layer and the gate electrode, on the buffer layer, providing a first electrode hole and a contact hole, by patterning the interlayer insulating layer and the buffer layer, where the first electrode hole corresponds to a portion of the first electrode area of the active layer and the contact hole corresponds to a portion of the oxygen supply layer, and providing a first electrode by patterning a second conductive material film on the interlayer insulating layer, wherein the first electrode is connected to the first electrode area of the active layer via the first electrode hole.

In an embodiment, the photoresist mask layer may include a first mask portion having a first mask thickness, and a second mask portion having a second mask thickness smaller than the first mask thickness. In such an embodiment, the method may further include, between the providing the light-shielding layer and the removing of the photoresist mask layer, removing the second mask portion of the photoresist mask layer, and additionally patterning the oxygen supply layer based on the first mask portion of the photoresist mask layer. In such an embodiment, in the additionally patterning of the oxygen supply layer, a portion of the oxygen supply layer corresponding to the first mask portion may have a first thickness, and another portion thereof may have a second thickness smaller than the first thickness.

In an embodiment, the method may further include planarizing a top surface of the buffer layer after the providing the buffer layer.

In an embodiment, after the planarizing of the top surface of the buffer layer, a portion of the buffer layer contacting the substrate may have a third thickness. In such an embodiment, the third thickness may exceed a sum of a thickness of the light-shielding layer and the first thickness of the portion of the oxygen supply layer.

In an embodiment, after the planarizing of the top surface of the buffer layer, another portion of the buffer layer disposed on the oxygen supply layer may have a fourth thickness. In such an embodiment, a sum of a thickness of the active layer and the fourth thickness is about 300 Å or smaller.

In an embodiment, in the providing the gate insulating layer and the gate electrode, an additional metal oxide material film disposed between the insulating material film and the first conductive material film is further patterned, such that an auxiliary oxygen supply layer may be provided between the gate insulating layer and the gate electrode.

In an embodiment, in the providing the first electrode, the first electrode is connected to the light-shielding layer via the contact hole and the oxygen supply layer.

In embodiments of the invention, the thin-film transistor includes the oxygen supply layer disposed on the light-shielding layer, and the active layer disposed on the buffer layer covering the oxygen supply layer. Accordingly, the heat treatment of the oxygen supply layer may allow the active layer to receive oxygens from the oxygen supply layer, such that semiconductor characteristic of the active layer may be improved. Accordingly, the threshold voltage characteristic of the thin-film transistor may be uniform.

In embodiments of the invention, the thin-film transistor includes the oxygen supply layer having portions of different thicknesses and the buffer layer having a planarized top surface. Accordingly, even when the contact hole penetrating the interlayer insulating layer and the buffer layer and the electrode hole defined through the interlayer insulating layer are formed in a same etching process, damage to the active layer may be prevented because a portion of the buffer layer corresponding to the contact hole is relatively thin. As a result, the number of mask processes may be reduced while suppressing the element damage, such that the manufacturing process of the transistor may be simplified.

BRIEF DESCRIPTION OF DRAWINGS

The above and other features of the disclosure will become more apparent by describing in detail embodiments thereof with reference to the attached drawings, in which.

DETAILED DESCRIPTIONS

Figure 1:
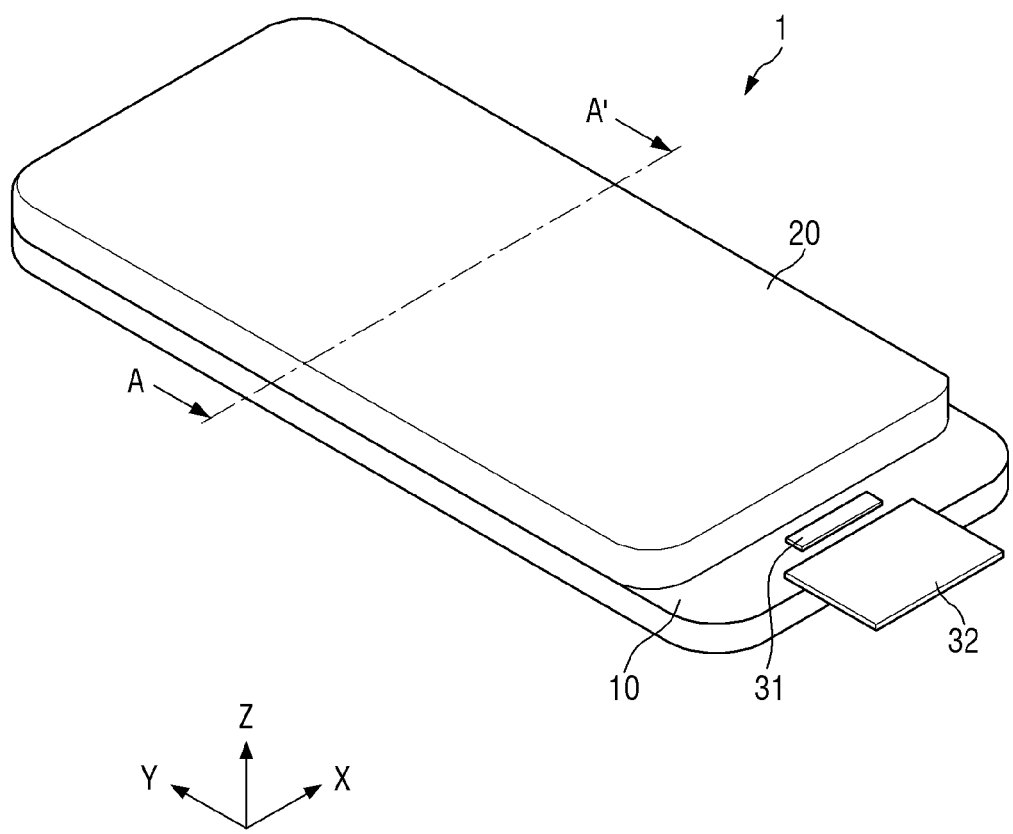
FIG. 1 is a perspective view showing a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
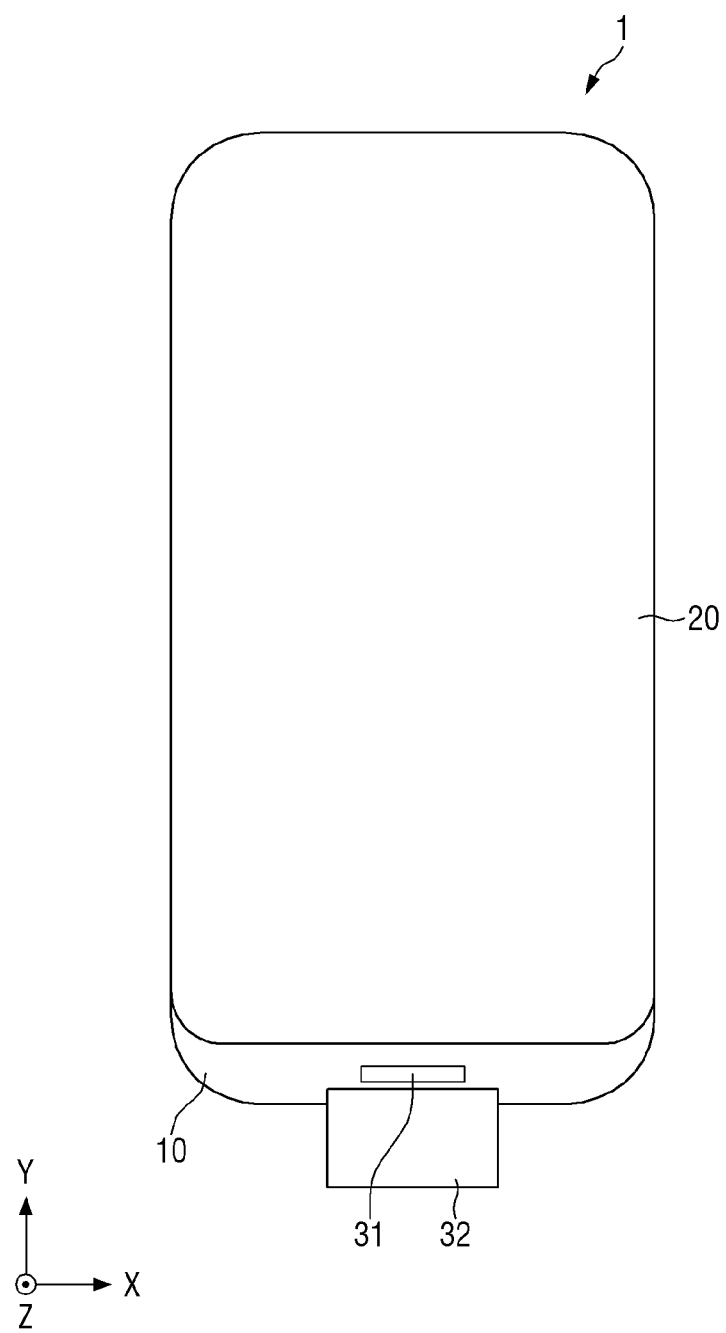
FIG. 2 is a plan view showing the display device of FIG. 1.
Figure 3:
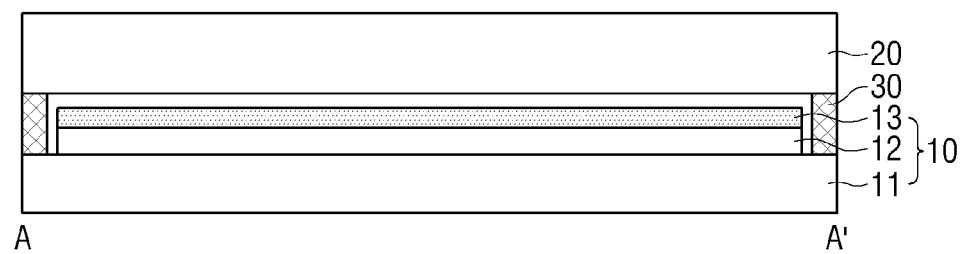
FIG. 3 is a schematic cross-sectional view taken along A-A' in FIG. 1.
Figure 4:
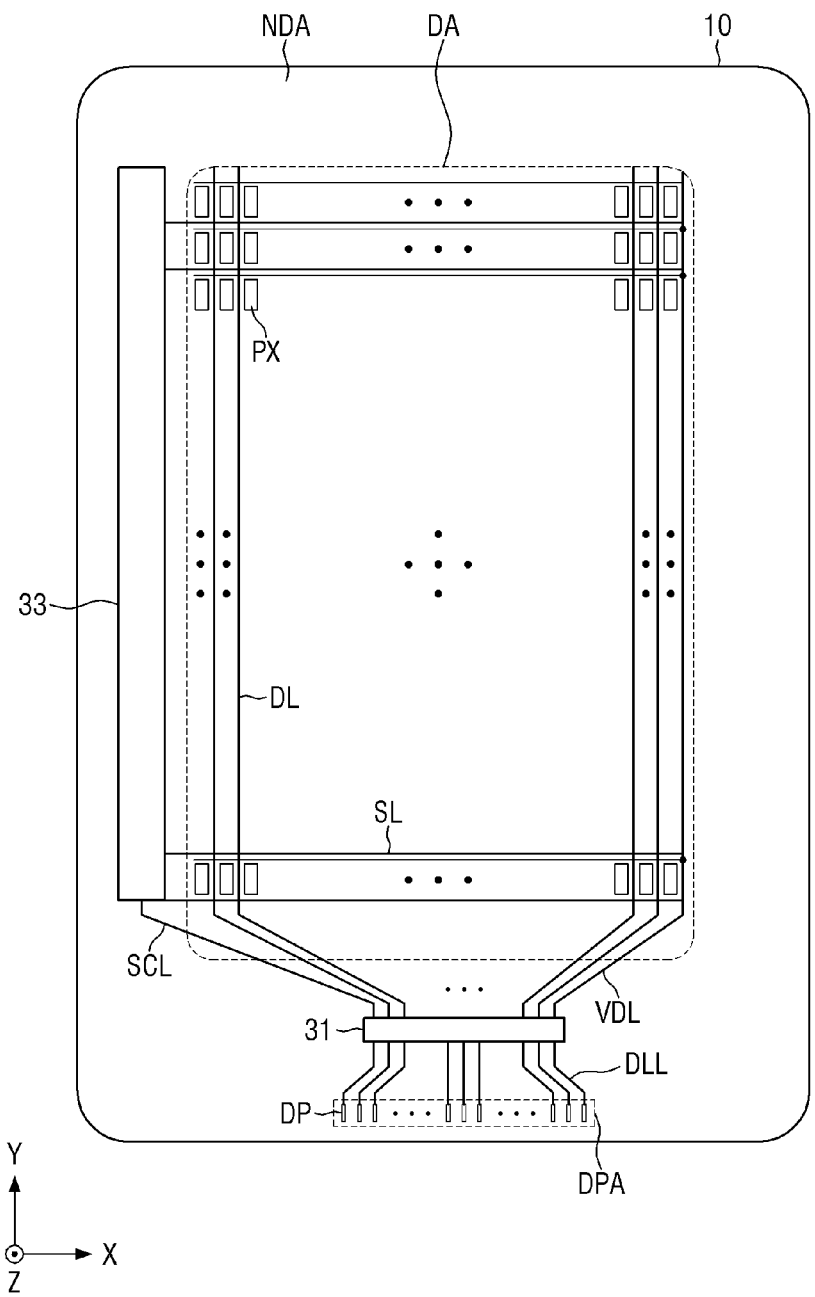
FIG. 4 is a plan view showing an embodiment of a thin-film transistor array substrate of FIG. 3.

FIG. 1 is a perspective view showing a display device according to an embodiment. FIG. 2 is a plan view showing the display device of FIG. 1. FIG. 3 is a schematic cross-sectional view showing an example of A-A' in FIG. 1. FIG. 4 is a plan view showing an example of a thin-film transistor array substrate of FIG. 3.

First, as used herein, "top", and "top surface" indicate a direction or a surface in which light from a display device 1 emits, that is, a Z-axis direction. Moreover, as used herein, "bottom" and "bottom surface" refer to an opposite direction to the Z-axis direction. Further, "left", "right", "upper" and "lower" indicate directions of a thin-film transistor array substrate 10 in a plan view. For example, "left" indicates a direction opposite to a X-axis direction, "right" indicates the X-axis direction, "upper" indicates a Y-axis direction, and "lower" indicates an opposite direction to the Y-axis direction.

Referring to FIG. 1, an embodiment of the display device 1 displays a moving image or a still image and may be used as a display screen of each of portable electronic devices such as mobile phones, smart phones, tablet personal computer ("PC"s), smart watches, watch phones, mobile communication terminals, e-books, portable multimedia players ("PMP"), navigation devices, and ultra-mobile PCs ("UMPC"), and each of various products such as televisions, laptops, monitors, billboards, interne of things ("IOT"), etc.

In an embodiment, the display device 1 may be embodied as a light-emitting display device such as an organic light-emitting display device using an organic light-emitting diode, a quantum dot light-emitting display device including a quantum dot light-emitting layer, an inorganic light-emitting display device including an inorganic semiconductor, or a micro light-emitting display device using a micro or nano light emitting diode (micro or nano "LED"). Hereinafter, embodiments in which the display device 1 is embodied as the organic light-emitting display device will be described. However, the disclosure is not limited thereto.

Referring to FIG. 1 and FIG. 2, an embodiment of the display device 1 may include the thin-film transistor array substrate 10 and a protective substrate 20 opposite to each other.

In an embodiment, the display device 1 may further include a display driver circuit 31 and a display circuit board 32 for driving the thin-film transistor array substrate 10.

Although not shown in detail in FIG. 1, the display device 1 may further include a light-emitting material or a polarizing material (not shown) embedded in the thin-film transistor array substrate 10 or disposed between the thin-film transistor array substrate 10 and the protective substrate 20.

In an embodiment, the display device 1 may further include an encapsulation structure for sealing a light-emitting material or a polarizing material disposed between the thin-film transistor array substrate 10 and the protective substrate 20.

The thin-film transistor array substrate 10 is configured to individually activate a light-emitting material or a polarizing material corresponding to a plurality of pixel areas arranged in a display area, such that light beams from a plurality of pixel areas having respective luminance or colors may emit to an outside through the thin-film transistor array substrate 10 or the protective substrate 20. Accordingly, the display device 1 may provide an image display function.

In an embodiment, the display device 1 may further include a touch sensing unit (not shown) for detecting coordinates of a point touched by a user on a display surface from which light for image display emits.

The touch sensing unit may be attached to one surface of the protective substrate 20, or may be embedded between the thin-film transistor array substrate 10 and the protective substrate 20.

The touch sensing unit may include a touch electrode (not shown) arranged in a touch sensing area corresponding to the display surface and include or formed of a transparent conductive material.

The touch sensing unit may periodically sense change in a capacitance value of the touch electrode while applying a touch drive signal to the touch electrode to detect whether a touch is input thereto, and the coordinates of a point where the touch is input.

The display surface of the display device 1 may have a rectangular shape having a short-side extending in the first direction (X-axis direction) and a long-side extending in the second direction (Y-axis direction) intersecting the first direction (X-axis direction). However, this is only an example. Alternatively, the display surface of the display device 1 may be implemented in various forms.

In an embodiment, for example, the display surface may have a shape in which a corner where the short-side extending in the first direction (X-axis direction) and the long-side extending in the second direction (Y-axis direction) meet each other is rounded to have a predefined curvature. Alternatively, the display surface may be in a form of a polygon, a circle, an oval, or the like.

FIG. 1 shows that the thin-film transistor array substrate 10 is in a form of a flat plate. However, the disclosure is not limited thereto. That is, the thin-film transistor array substrate 10 may have a shape in which both opposing ends in the Y-axis direction are bent. Alternatively, the thin-film transistor array substrate 10 may be flexible to be able to bend, fold, or roll.

The protective substrate 20 may be bonded to the thin-film transistor array substrate 10.

The protective substrate 20 may provide rigidity to protect against external physical and electrical shocks. The protective substrate 20 may include or be formed of a transparent material having insulating properties and rigidity.

The display driver circuit 31 outputs signals and voltages for driving the thin-film transistor array substrate 10.

In an embodiment, for example, the display driver circuit 31 may supply a data signal to a data line (DL in FIG. 4) of the thin-film transistor array substrate 10, and may supply first drive power to a first drive power line (VDL of FIG. 4) of the thin-film transistor array substrate 10. In an embodiment, the display driver circuit 31 may supply a scan control signal to a scan driver (33 in FIG. 4) built in the thin-film transistor array substrate 10.

The display driver circuit 31 may be embodied as an integrated circuit ("IC").

An IC chip of the display driver circuit 31 may be directly mounted on the thin-film transistor array substrate 10 using a chip on glass ("COG") scheme, a chip on plastic ("COP") scheme, or an ultrasonic bonding scheme. In an embodiment, as shown in FIG. 2, the IC chip of the display driver circuit 31 may be disposed in an area of the thin-film transistor array substrate 10 not covered with the protective substrate 20.

Alternatively, the IC chip of the display driver circuit 31 may be mounted on the display circuit board 32.

The display circuit board 32 may include an anisotropic conductive film. The display circuit board 32 may be embodied as a flexible film such as a flexible printed circuit board, a printed circuit board or a chip on film.

The display circuit board 32 may be attached to electrode pads of the thin-film transistor array substrate 10. Accordingly, lead lines of the display circuit board 32 may be electrically connected to electrode pads of the thin-film transistor array substrate 10.

Figure 6:
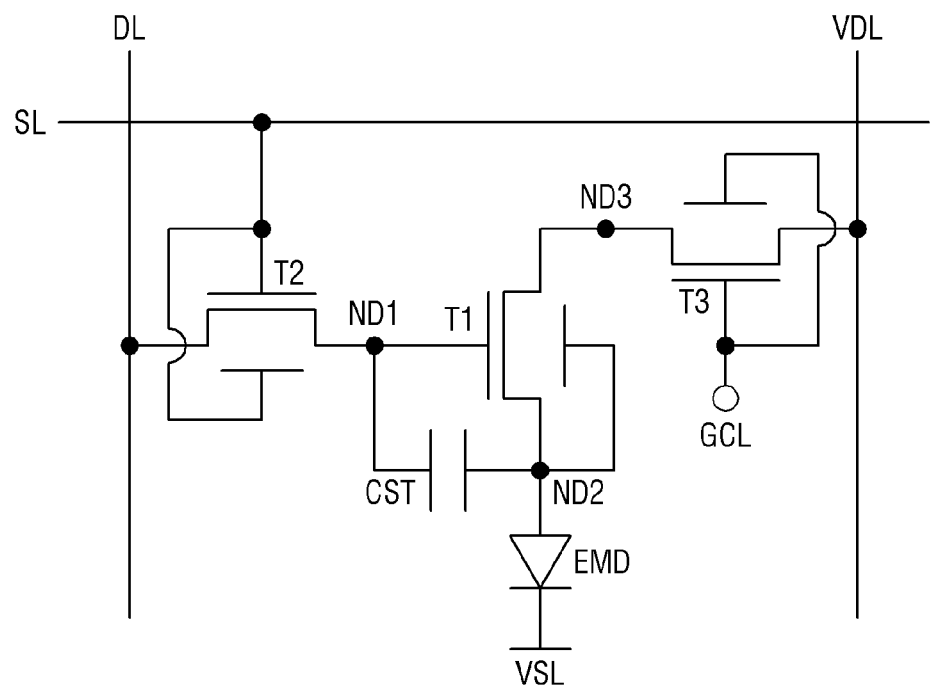
FIG. 6 is an equivalent circuit diagram showing an embodiment of a pixel driver circuit corresponding to one pixel area in FIG. 5.

Referring to FIG. 3, when the display device 1 is embodied as an organic light-emitting display device, the thin-film transistor array substrate 10 may include a substrate 11 having a display area (DA of FIG. 4), a circuit array 12 disposed on the substrate 11 and including a plurality of thin-film transistors (T1, T2 and T3 of FIG. 6), and a light-emitting array 13 disposed on the circuit array 12 and including a plurality of light-emitting elements (EMD in FIG. 6).

The display device 1 may further include a sealing layer 30 disposed at an edge and between the thin-film transistor array substrate 10 and the protective substrate 20 for bonding the thin-film transistor array substrate 10 and the protective substrate 20 to each other.

In an embodiment, the display device 1 may further include a filling layer (not shown) filling a gap between the thin-film transistor array substrate 10 and the protective substrate 20.

Referring to FIG. 4, the thin-film transistor array substrate 10 has the display area DA that emits light for image display, and a non-display area NDA surrounding the display area DA. The non-display area NDA may refer to an area from an outer edge of the display area DA to an outer edge of the substrate (11 in FIG. 3).

The thin-film transistor array substrate 10 includes a plurality of pixel areas PX arranged in a matrix along vertical and horizontal directions in the display area DA. Each of the plurality of pixel areas PX may be a unit area for displaying individual luminance.

The non-display area NDA may include a display electrode pad area DPA disposed adjacent to the edge of the substrate 11. The thin-film transistor array substrate 10 may further include a display electrode pad DP disposed in the display electrode pad area DPA of the non-display area NDA.

The display circuit board (32 in FIG. 1 and FIG. 2) may be attached to the display electrode pad area DPA of the thin-film transistor array substrate 10 and may be electrically connected to the display electrode pad DP.

The thin-film transistor array substrate 10 further includes lines disposed on the display area DA for supplying a signal or power to the plurality of pixel areas PX. The lines of the thin-film transistor array substrate 10 may include the scan line SL, the data line DL, and the first drive power line VDL.

The scan line SL may extend in a horizontal or left-right direction (X direction).

The data line DL may extend in a vertical or upper-lower direction (Y direction).

The first drive power line VDL may extend in at least one of the left-right direction (X direction) and the upper-lower direction (Y direction). In an embodiment, for example, the first drive power line VDL may extend in the upper-lower direction (Y direction) as the data line DL extends.

The scan line SL supplies a scan signal for selecting a pixel area to which a data signal is to be written to pixel areas arranged in in the left-right direction (X direction).

The scan line SL may be connected to a scan driver 33 disposed in a portion of the non-display area NDA of the thin-film transistor array substrate 10.

The scan driver 33 may receive a scan control signal from the display driver circuit 31 via at least one scan control line SCL.

The scan driver 33 may sequentially supply the scan signal to a plurality of scan lines SL arranged in the display area DA for each frame period for image display, based on the scan control signal.

According to an embodiment, as illustration of FIG. 4, the scan driver 33 is disposed in a portion of the non-display area NDA adjacent to a left side of the display area DA. However, this is only an example. Alternatively, the scan driver 33 may be disposed in another portion of the non-display area NDA adjacent to a right side of the display area DA. Alternatively, the scan driver 33 may be respectively disposed on both opposing sides in the left-right direction of the display area DA.

The data line DL is connected to pixel areas arranged in the upper-lower direction (Y direction) and supplies a data signal corresponding to luminance of each pixel area.

The data line DL may be connected to the display driver circuit 31, and the display driver circuit 31 may supply a data signal of each of the pixel areas to which the scan signal is supplied to the data line DL.

The display driver circuit 31 may be connected to the display electrode pad DP via a data link line DLL and may receive digital video data and timing signals from the display circuit board 32 connected to the display electrode pad DP.

The first drive power line VDL supplies the first drive power to drive the light-emitting element (EMD in FIG. 6).

The first drive power line VDL may receive the first drive power from the display driver circuit 31 or the display circuit board 32.

Each of the plurality of pixel areas PX includes a pixel driver circuit that supplies a driving current to the light-emitting element EMD based on the power and the signals supplied thereto via the scan line SL, the data line DL and the first drive power line VDL, etc. The pixel driver circuit will be described later with reference to FIG. 6.

Figure 5:
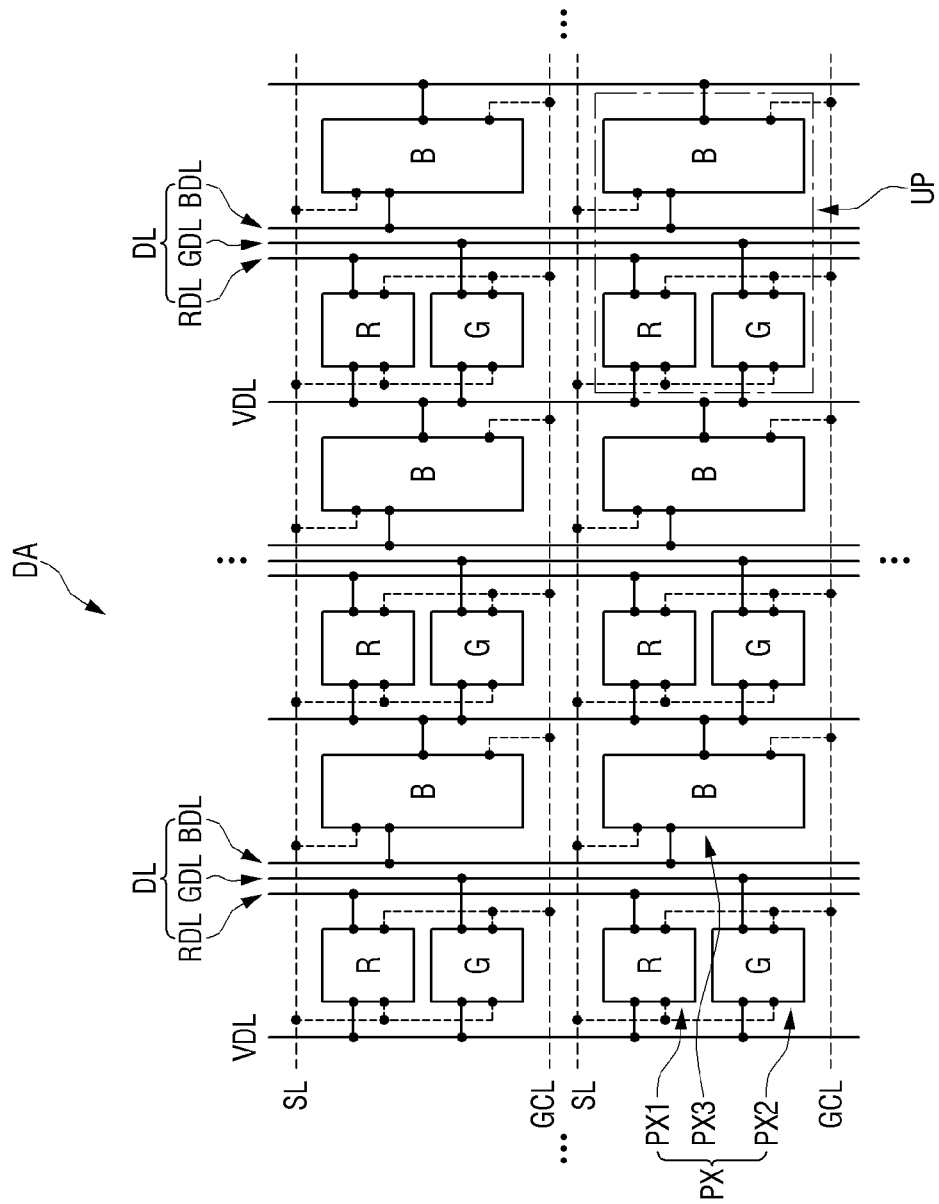
FIG. 5 is a block diagram showing an embodiment of a portion of a display area of the thin-film transistor array substrate of FIG. 4.

FIG. 5 is a block diagram showing an embodiment of a portion of the display area of the thin-film transistor array substrate of FIG. 4.

Referring to FIG. 5, in the display area DA of the thin-film transistor array substrate 10, a plurality of pixel areas PX PX1, PX2, and PX3 are arranged side by side.

In order for the display device 1 to display a color image, each of the plurality of pixel areas PX may correspond to one of two or more different colors.

In an embodiment, for example, each of the plurality of pixel areas PX may emit light of one of red R, green G, and blue B. That is, the plurality of pixel areas PX may include a first pixel area PX1 corresponding to red R, a second pixel area PX2 corresponding to green G, and a third pixel area PX3 corresponding to blue B.

Alternatively, the plurality of pixel areas PX may emit light of one of red, green, blue, and white.

A unit pixel UP which is composed of or defined by a combination of two or more pixel areas of the plurality of pixel areas PX adjacent to each other and emitting different colors and acts as a unit for displaying various colors including white may be implemented.

In an embodiment where the unit pixels UP are arranged side by side, pixel areas corresponding to different colors are arranged adjacent to each other. That is, pixel areas of different colors are alternately arranged in the left-right direction or the upper-lower direction of the display area DA.

In an embodiment, for example, the display area DA may include a first vertical line in which the first pixel area PX1 and the second pixel area PX2 are alternately arranged with each other in the upper-lower direction, and a second vertical line in which the third pixel areas PX3 are arranged side by side in the upper-lower direction. The first and second vertical lines may be alternately arranged with each other in the horizontal direction.

In an embodiment, the third pixel area PX3 may have a width larger than that of each of the first pixel area PX1 and the second pixel area PX2 because luminance of blue light may not be easily controlled, compared to that of each of red light and green light. In an embodiment, for example, the width of the third pixel area PX3 may correspond to a sum of the width of the first pixel area PX1 and the width of the second pixel area PX2.

In an embodiment, one unit pixel UP may be implemented as a combination of the first pixel area PX1 and the second pixel area PX2 adjacent to each other in the upper-lower direction, and the third pixel area PX3 adjacent thereto in the left-right direction.

However, an arrangement form of the pixel areas as shown in FIG. 5 is only an example. The disclosure may include a plurality of pixel areas arranged in a different manner from that of FIG. 5.

Referring to FIG. 5, the scan line SL may be disposed at one side (an upper side of FIG. 5) in the upper-lower direction of the unit pixel UP.

The first pixel area PX1, the second pixel area PX2, and the third pixel area PX3 included in the unit pixel UP may be connected to the same scan line SL.

In an embodiment, the data line DL of the thin-film transistor array substrate 10 may include a first data line RDL connected to the first pixel area PX1 corresponding to red R, a second data line GDL connected to the second pixel area PX2 corresponding to green G, and a third data line BDL connected to the third pixel area PX3 corresponding to blue B.

In an embodiment, the display area DA of the thin-film transistor array substrate 10 may further include a global control line GCL for supplying a global control signal to the plurality of pixel areas PX. The global control signal may be configured for collectively controlling supply of the power supply to the display area DA.

The global control line GCL may be disposed at the other side (at a lower side of FIG. 5) in the upper-lower direction of the unit pixel UP. In an embodiment, although not shown in FIG. 5, the thin-film transistor array substrate 10 may further include an auxiliary global control line (GCL' in FIG. 7) connected to the global control line GCL and extending in a vertical direction, in an adapted manner to a structure in which the first pixel area PX1 and the second pixel area PX2 are alternately arranged with each other in the upper-lower direction.

In such an embodiment, each unit pixel UP may be connected to the first data line RDL, the second data line GDL, and the third data line BDL, the first drive power line VDL, the scan line SL, and the global control line GCL.

In an embodiment, for example, the first drive power line VDL may be disposed at each of both opposing sides in the left-right direction of each unit pixel UP. The first data line RDL, the second data line GDL, and the third data line BDL may be spaced apart from the first drive power line VDL. That is, the first data line RDL, the second data line GDL, and the third data line BDL may be arranged side by side in the horizontal direction and disposed between the vertical lines within each unit pixel UP, that is, between the first vertical line in which the first pixel area PX1 and the second pixel area PX2 are arranged with each other and the second vertical line in which the third pixel areas PX3 are arranged with each other. The scan line SL may be disposed at one side in the vertical direction of each unit pixel UP.

In such an embodiment, the first data line RDL and the second data line GDL may be disposed adjacent to the first vertical line, and the third data line BDL may be disposed adjacent to the second vertical line.

In an embodiment, the first drive power line VDL may be shared by the vertical lines disposed around the first drive power line VDL.

FIG. 6 is an equivalent circuit diagram showing an embodiment of a pixel driver circuit corresponding to one pixel area in FIG. 5.

Referring to FIG. 6, each pixel area (PX in FIG. 4 and FIG. 5) may include a light-emitting element EMD, a first thin-film transistor T1, a second thin-film transistor T2, a third thin-film transistor T3, and a storage capacitor CST.

In an embodiment, the light-emitting element EMD may be embodied as an organic light-emitting diode including a light-emitting layer including or formed of an organic light-emitting material. Alternatively, the light-emitting element EMD may include a light-emitting layer formed of a photoelectric conversion material.

The first thin-film transistor T1 is connected in series with the light-emitting element EMD while being connected between a first drive power line VDL and a second drive power line VSL. The second drive power line VSL may be a line for supplying second drive power at a lower voltage level than that of the first drive power which the first drive power line VSL supplies.

In an embodiment, an anode electrode of the light-emitting element EMD may be connected to a drain electrode of the first thin-film transistor T1, and a cathode electrode of the light-emitting element EMD may be connected to the second drive power line VSL.

In an embodiment, a source electrode of the first thin-film transistor T1 may be connected to the first drive power line VDL.

However, a connection node between the source electrode and the drain electrode may have a configuration varying according to a structure type of the first thin-film transistor T1.

The storage capacitor CST is disposed between a first node ND1 and a second node ND2. The first node ND1 refers to a contact point connected to a gate electrode of the first thin-film transistor T1. The second node ND2 refers to a contact point between the first thin-film transistor T1 and the light-emitting element EMD.

The second thin-film transistor T2 is connected to and disposed between the data line DL and the first node ND1 and is turned on based on the scan signal of the scan line SL. When the second thin-film transistor T2 is turned on based on the scan signal of the scan line SL, the data signal of the data line DL is supplied to the storage capacitor CST and the gate electrode of the first thin-film transistor T1 via the second thin-film transistor T2 and the first node ND1.

The third thin-film transistor T3 is connected to and disposed between the first drive power line VDL and a third node ND3, and is turned on based on the global control signal of the global control line GCL. The third node ND3 refers to a contact point between the source electrode of the first thin-film transistor T1 and the third thin-film transistor T3.

When the third thin-film transistor T3 is turned on based on the global control signal of the global control line GCL, the first drive power of the first drive power line VDL is supplied to the third node ND3.

In an embodiment, the first thin-film transistor T1 generates a drive current corresponding to a voltage difference between a voltage of the source electrode and a voltage of the gate electrode, that is, a voltage difference between a voltage of the first node ND1 and a voltage of the third node ND3, between the first drive power line VDL and between the second drive power line VSL. In such an embodiment, the light-emitting element EMD emits light of luminance corresponding to the driving current generated by the first thin-film transistor T1.

In an embodiment, as shown in FIG. 6, the first thin-film transistor T1 may further include an auxiliary gate electrode connected to the second node ND2 to form a stable channel.

The second thin-film transistor T2 may further include an auxiliary gate electrode connected to the scan line SL to form a stable channel.

The third thin-film transistor T3 may further include an auxiliary gate electrode connected to the global control line GCL to form a stable channel.

In an embodiment, for example, as shown in FIG. 6, the pixel driver circuit of each of the plurality of pixel areas PX has a three-transistor-one-capacitor ("3T1C") structure including the first thin-film transistor T1, the second thin-film transistor T2 and the third thin-film transistor T3. However, this is only an example. That is, the pixel driver circuit is not limited to 3T1C structure, and may have various structures including a 2T1C structure that does not include the third thin-film transistor T3.

FIG. 6 shows an embodiment where each of the first thin-film transistor T1, the second thin-film transistor T2 and the third thin-film transistor T3 is embodied as a metal oxide semiconductor field effect transistor ("MOSFET"). However, this is only an example. In an embodiment, at least one selected from the first thin-film transistor T1, the second thin-film transistor T2, and the third thin-film transistor T3 may be embodied as a P-type MOSFET.

Figure 7:
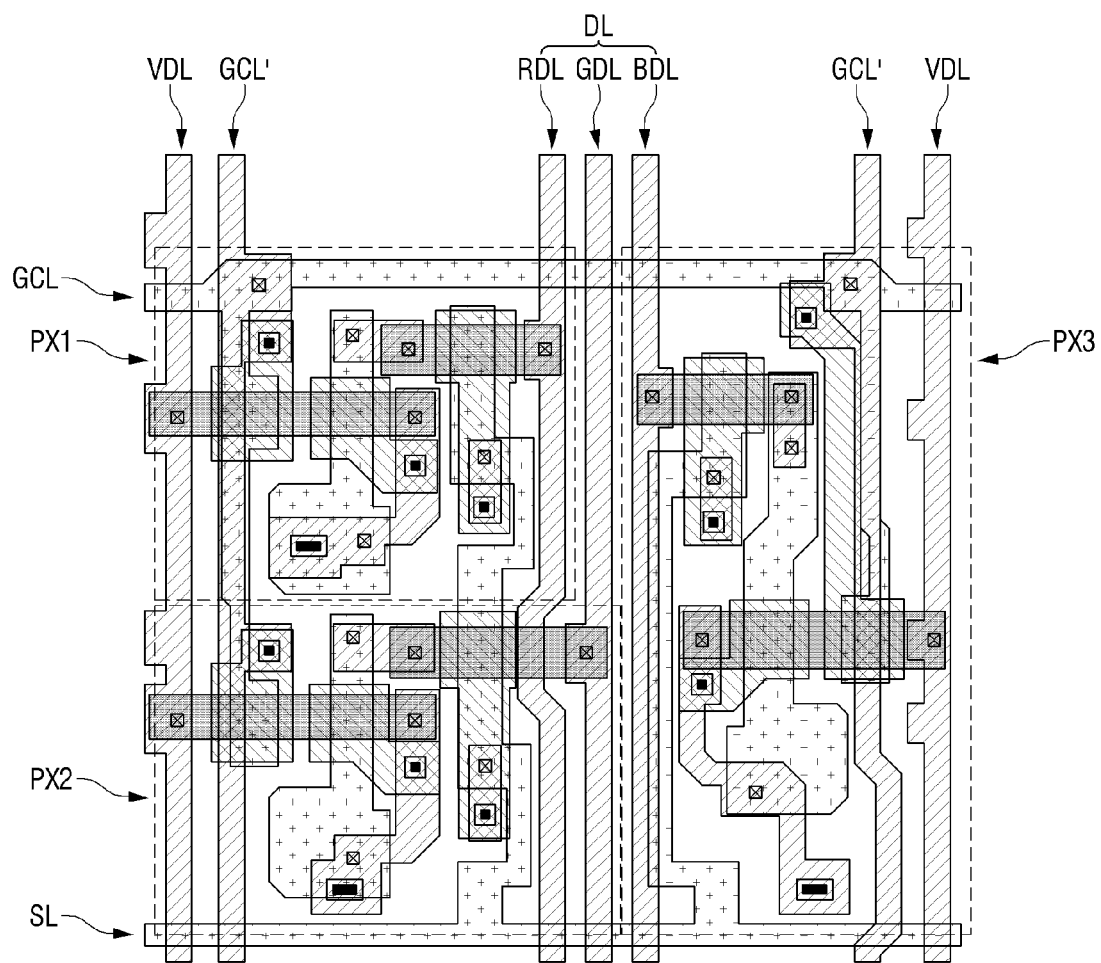
FIG. 7 is a plan view showing an embodiment of one unit pixel in FIG. 5.
Figure 8:
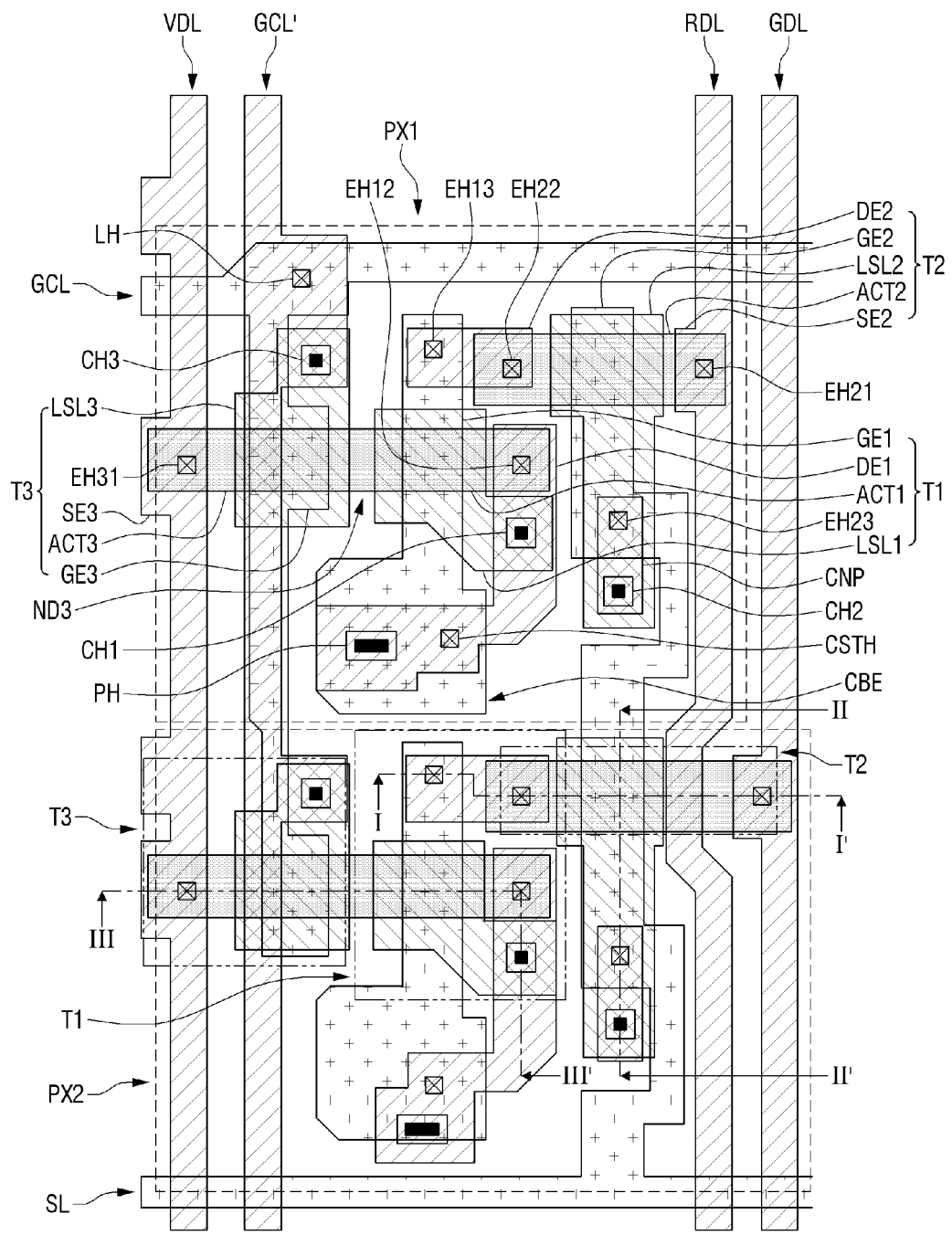
FIG. 8 is a plan view showing first and second pixel areas of FIG. 7 in detail.
Figure 9:
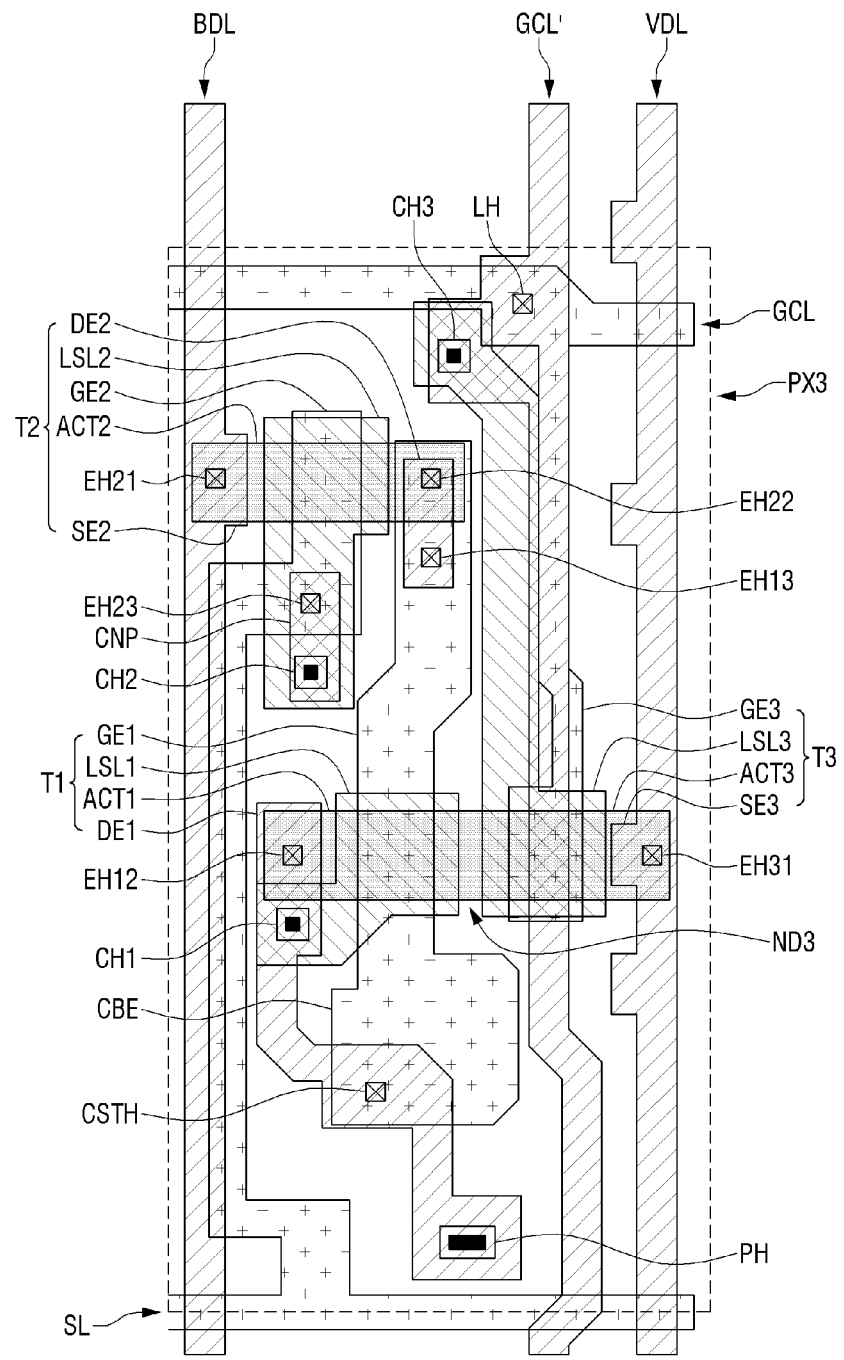
FIG. 9 is a plan view showing a third pixel area of FIG. 7 in detail.

FIG. 7 is a plan view showing an embodiment of one unit pixel in FIG. 5. FIG. 8 is a plan view showing first and second pixel areas of FIG. 7 in detail. FIG. 9 is a plan view showing a third pixel area of FIG. 7 in detail.

Referring to FIG. 7, in an embodiment, the unit pixel UP may be composed of or defined by a combination of a first pixel area PX1 corresponding to a first color, a second pixel area PX2 corresponding to a second color, and a third pixel area PX3 corresponding to the third color. In an embodiment, for example, the first color, the second color and the third color may be red, green and blue, respectively.

Because high luminance of blue is not easily controlled compared to that of each of red and green, the third pixel area PX3 corresponding to blue may have a larger width than that of each of the first pixel area PX1 corresponding to red and the second pixel area PX2 corresponding to green.

In an embodiment, where the first pixel area PX1 and the second pixel area PX2 are alternately arranged with each other in the upper-lower direction, and the third pixel area PX3 is arranged adjacent to the first pixel area PX1 and the second pixel area PX2 in the horizontal direction, a length in a vertical direction of the third pixel area PX3 may correspond to a sum of lengths in the vertical direction of the first pixel area PX1 and the second pixel area PX2.

The thin-film transistor array substrate 10 may include the global control line GCL extending in the horizontal direction and the auxiliary global control line GCL' extending in the vertical direction.

The auxiliary global control line GCL' may extend in parallel to the first drive power line VDL.

In an embodiment where the scan line SL is disposed at one side (a lower side of FIG. 7) in the vertical direction of the unit pixel UP, the global control line GCL may be disposed at the other side (an upper side of FIG. 7) in the vertical direction of the unit pixel UP. The scan line SL and the global control line GCL of a corresponding unit pixel may be disposed adjacent to a global control line GCL and a scan line SL of a unit pixel adjacent thereto in the vertical direction, respectively.

In an embodiment, as shown in FIG. 6, each of the first pixel area PX1 and the second pixel area PX2 may include the first thin-film transistor T1 connected to the light-emitting element EMD, the second thin-film transistor T2 connected to the data line DL, the scan line SL and the first thin-film transistor T1, and the third thin-film transistor T3 connected to the first drive power line VDL, the global control line GCL, and the first thin-film transistor T1.

Referring to FIG. 8, the first thin-film transistor T1 may be disposed between the second thin-film transistor T2 and the third thin-film transistor T3.

The second thin-film transistor T2 may be disposed adjacent to an intersection between the scan line SL and the data line RDL and GDL.

The third thin-film transistor T3 may be disposed adjacent to the intersection point between the global control line GCL extending in the horizontal direction and the first drive power line VDL.

Each of the first thin-film transistor T1, the second thin-film transistor T2 and the third thin-film transistor T3 may include a light-shielding layer LSL1, LSL2, or LSL3, an active layer ACT1, ACT2, or ACT3, a gate electrode GE1, GE2, or GE3, a source electrode SE2 or SE3 and a drain electrode DE1 and DE2.

In such an embodiment, the third node ND3 at which the source electrode of the first thin-film transistor T1 and the drain electrode of the third thin-film transistor T3 are connected to each other may be implemented via connection between the active layer ACT1 of the first thin-film transistor T1 and the active layer ACT3 of the third thin-film transistor T3. In such an embodiment, a pattern corresponding to the source electrode of the first thin-film transistor T1 and the drain electrode of the third thin-film transistor T3 may not be separately defined.

The gate electrode GE2 of the second thin-film transistor T2 of the first pixel area PX1 may be composed of or defined by a portion of a pattern branched from the scan line SL in the upper-lower direction.

The active layer ACT2 of the second thin-film transistor T2 of the first pixel area PX1 may be composed of or defined by a pattern which intersects the gate electrode GE2 of the second thin-film transistor T2 and whose one side overlaps the first data line RDL.

The source electrode SE2 of the second thin-film transistor T2 of the first pixel area PX1 may be composed of or defined by a pattern which branches in the left-right direction from the first data line RDL and overlaps one side of the active layer ACT2 of the second thin-film transistor T2.

The second thin-film transistor T2 may further include a source electrode hole EH21 disposed in an overlapping area between source electrode SE2 of the second thin-film transistor T2 and active layer ACT2 of the second thin-film transistor T2. The source electrode SE2 of the second thin-film transistor T2 may be connected to one side of the active layer ACT2 of the second thin-film transistor T2 via the source electrode hole EH21 of the second thin-film transistor T2.

The drain electrode DE2 of the second thin-film transistor T2 of the first pixel area PX1 may be composed of or defined by a pattern overlapping the other side of the active layer ACT2 of the second thin-film transistor T2.

The second thin-film transistor T2 may further include a drain electrode hole EH22 disposed in an overlapping area between the drain electrode DE2 of the second thin-film transistor T2 and the active layer ACT2 of the second thin-film transistor T2. The drain electrode DE2 of the second thin-film transistor T2 may be connected to the other side of the active layer ACT2 of the second thin-film transistor T2 via the drain electrode hole EH22 of the second thin-film transistor T2.

The light-shielding layer LSL2 of the second thin-film transistor T2 of the first pixel area PX1 may be composed of or defined by a pattern partially overlapping with the gate electrode GE2 of the second thin-film transistor T2.

In an embodiment, a gate electrode hole EH23 corresponding to (e.g., overlapping) a portion of the gate electrode GE2 of the second thin-film transistor T2, a contact hole CH2 corresponding to a portion of a light-shielding layer LSL2 of the second thin-film transistor T2, and a connective pattern CNP connecting the gate electrode hole EH23 of the second thin-film transistor T2 and the contact hole CH2 of the second thin-film transistor T2 to each other may be defined in the second thin-film transistor T2.

The light-shielding layer LSL2 of the second thin-film transistor T2 may be connected to the gate electrode GE2 of the second thin-film transistor T2 via the gate electrode hole EH23 of the second thin-film transistor T2, the contact hole CH2 of the second thin-film transistor T2, and the connective pattern CNP.

The global control line GCL extending in the horizontal direction may be connected to the global control line GCL' extending in the vertical direction via a line hole LH.

The gate electrode GE3 of the third thin-film transistor T3 of the first pixel area PX1 may be composed of or defined by a portion having a pattern branching from the global control line GCL in the upper-lower direction.

The active layer ACT3 of the third thin-film transistor T3 of the first pixel area PX1 may be composed of or defined by a pattern which intersects the gate electrode GE3 of the third thin-film transistor T3 and whose one side overlaps the first drive power line VDL.

The source electrode SE3 of the third thin-film transistor T3 of the first pixel area PX1 may be composed of or defined by portion of the first drive power line VDL overlapping the active layer ACT3 of the third thin-film transistor T3.

The third thin-film transistor T3 may further include a source electrode hole EH31 disposed in an overlapping area between the source electrode SE3 of the third thin-film transistor T3 and the active layer ACT3 of the third thin-film transistor T3. The source electrode SE3 of the third thin-film transistor T3 may be connected to one side of the active layer ACT3 of the third thin-film transistor T3 via the source electrode hole EH31 of the third thin-film transistor T3.

The drain electrode (not shown) of the third thin-film transistor T3 of the first pixel area PX1 corresponds to the third node ND3. The third node ND3 may be implemented via connection between the active layer ACT3 of the third thin-film transistor T3 and the active layer ACT1 of the first thin-film transistor T1. Thus, the drain electrode (not shown) of the third thin-film transistor T3 may not be separately provided.

The light-shielding layer LSL3 of the third thin-film transistor T3 of the first pixel area PX1 may be composed of a pattern partially overlapping with the gate electrode GE3 of the third thin-film transistor T3.

The light-shielding layer LSL3 of the third thin-film transistor T3 of the first pixel area PX1 may partially overlap with a pattern branching in the horizontal direction from the auxiliary global control line GCL'.

In an embodiment, a contact hole CH3 corresponding to an overlapping area between the pattern branching in the horizontal direction from the auxiliary global control line GCL' and the light-shielding layer LSL3 of the third thin-film transistor T3 may be defined in the third thin-film transistor T3.

The light-shielding layer LSL3 of the third thin-film transistor T3 may be connected to the auxiliary global control line GCL' via the contact hole CH3 of the third thin-film transistor T3. Accordingly, both the light-shielding layer LSL3 and the gate electrode GE3 of the third thin-film transistor T3 are connected to the global control line GCL.

The gate electrode GE1 of the first thin-film transistor T1 of the first pixel area PX1 may be composed of or defined by a pattern whose one end overlaps a portion of the drain electrode DE2 of the second thin-film transistor T2.

The other end of the gate electrode GE1 of the first thin-film transistor T1 may extend to an extent, e.g., as large as possible, within an effective area of the first pixel area PX1 not to be in contact with the gate electrodes GE2 and GE3 of the second and third thin-film transistors T2 and T3, and not to overlap the light-shielding layers LSL2 and LSL3 and the active layers ACT2 and ACT3 of the second and third thin-film transistors T2 and T3. The other end of the gate electrode GE1 of the first thin-film transistor T1 may act as a lower electrode CBE (Capacitor Bottom Electrode) the storage capacitor (CST in FIG. 6).

Although not shown in FIG. 8, the thin-film transistor array substrate 10 may further include an upper electrode (not shown) of the storage capacitor CST disposed in a layer different from a layer of the lower electrode CBE, the source electrode SE2 and SE3, and the drain electrode DE1 and DE2, and overlapping the lower electrode CBE.

In an embodiment, a gate electrode hole EH13 corresponding to a portion of an overlapping area between the gate electrode GE1 of the first thin-film transistor T1 and the drain electrode DE2 of the second thin-film transistor T2 may be defined in the first thin-film transistor T1.

The gate electrode GE1 of the first thin-film transistor T1 may be connected to the drain electrode DE2 of the second thin-film transistor T2 via the gate electrode hole EH13.

The active layer ACT1 of the first thin-film transistor T1 may be composed of or defined by a pattern which intersects the gate electrode GE1 of the first thin-film transistor T1 and one side of which contacts the active layer ACT3 of the third thin-film transistor T3.

The third node ND3 may be implemented via the connection between the active layer ACT1 of the first thin-film transistor T1 and the active layer ACT3 of the third thin-film transistor T3. Accordingly, the source electrode (not shown) of the first thin-film transistor T1 may be excluded.

The drain electrode DE1 of the first thin-film transistor T1 may be composed of or defined by a pattern overlapping the other side of the active layer ACT1 of the first thin-film transistor T1.

A portion of the drain electrode DE1 of the first thin-film transistor T1 may overlap the other side of the active layer ACT1 of the first thin-film transistor T1. Another portion of the drain electrode DE1 of the first thin-film transistor T1 may overlap the light-shielding layer LSL1 of the first thin-film transistor T1. Still another portion thereof may overlap the gate electrode GE1 of the first thin-film transistor T1, that is, the lower electrode CBE.

In an embodiment, a drain electrode hole EH12 disposed in the overlapping area between the drain electrode DE1 of the first thin-film transistor T1 and the active layer ACT1 of the first thin-film transistor T1, and a contact hole CH1 disposed in an overlapping area between the drain electrode DE1 of the first thin-film transistor T1 and the light-shielding layer LSL1 of the first thin-film transistor T1 may be defined in the first thin-film transistor T1.

The drain electrode DE1 of the first thin-film transistor T1 may be connected to the other side of the active layer ACT1 of the first thin-film transistor T1 via the drain electrode hole EH12 of the first thin-film transistor T1.

In an embodiment, a capacitor hole CSTH for connecting the drain electrode DE1 of the first thin-film transistor T1 and the upper electrode (not shown) of the storage capacitor CST to each other, and a pixel hole PH for connecting the drain electrode DE1 of the first thin-film transistor T1 and the anode electrode of the EMD of the light-emitting element (EMD in FIG. 6) to each other may be further defined in the first thin-film transistor T1. The capacitor hole CSTH and the pixel hole PH may overlap the drain electrode DE1 of the first thin-film transistor T1 and may be spaced apart from each other.

The light-shielding layer LSL1 of the first thin-film transistor T1 may be composed of or defined by a pattern including a portion overlapping both the gate electrode GE1 of the first thin-film transistor T1 and the active layer ACT1 of the first thin-film transistor T1.

The light-shielding layer LSL1 of the first thin-film transistor T1 may be connected to the drain electrode DE1 of the first thin-film transistor T1 via the contact hole CH1 of the first thin-film transistor T1.

The second pixel area PX2 may be disposed adjacent to the first pixel area PX1 in the vertical direction.

The first, second and third thin-film transistors T1, T2, and T3 of the second pixel area PX2 are respectively substantially to the same as the first, second and third thin-film transistors T1, T2, and T3 of the first pixel area PX1 except that the source electrode SE2 of the second thin-film transistor T2 is composed of or defined by a pattern branching from the second data line GDR, and the gate electrode GE3 of the third thin-film transistor T3 is composed of or defined by a pattern branching in the horizontal direction from the auxiliary global control line GCL' extending in the vertical direction. Therefore, any repetitive detailed descriptions thereof will be omitted.

Referring to FIG. 7, the third pixel area PX3 may be disposed adjacent to one side in the left-right direction of each of the first pixel area PX1 and the second pixel area PX2.

Referring to FIG. 9, the first, second and third thin-film transistors T1, T2, and T3 of the third pixel area PX3 are respectively substantially to the same as the first, second and third thin-film transistors T1, T2, and T3 of the first pixel area PX1 except that the source electrode SE2 of the second thin-film transistor T2 is composed of or defined by a pattern branching from the third data line BDR. Therefore, any repetitive detailed descriptions thereof will be omitted.

Next, various embodiments of a thin-film transistor will be described.

Figure 10:
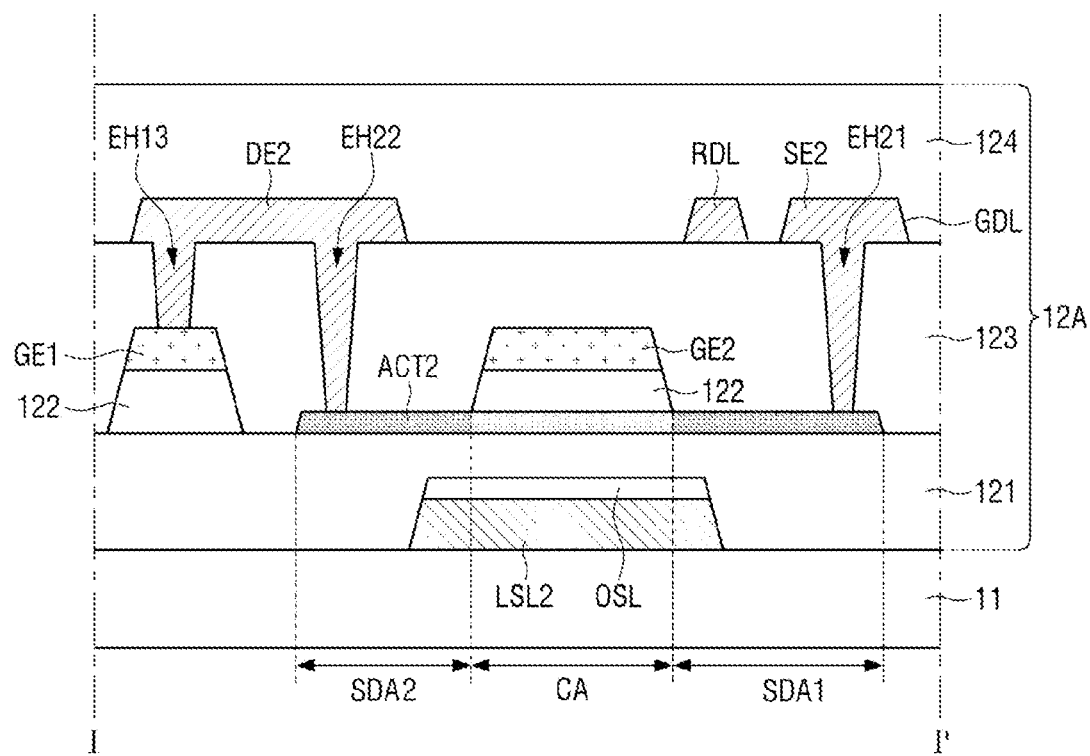
FIG. 10 is a cross-sectional view taken along line I-I' in FIG. 8 according to an embodiment.
Figure 11:
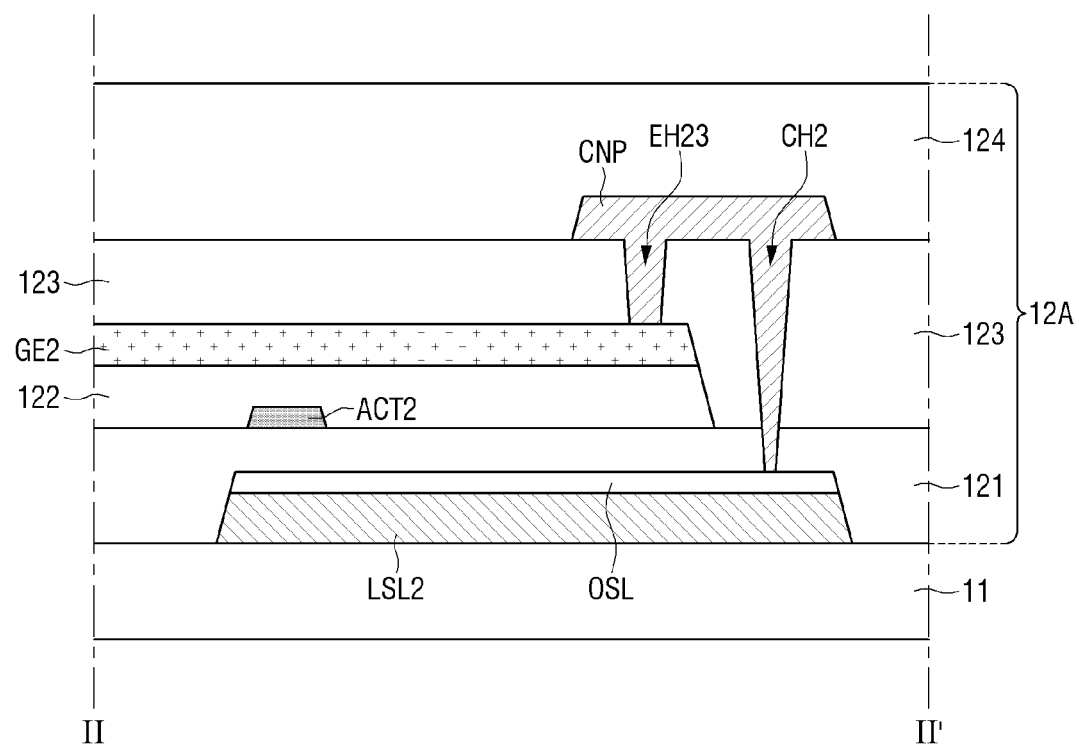
FIG. 11 is a cross-sectional view taken along line II-II' in FIG. 8 according to an embodiment.
Figure 12:
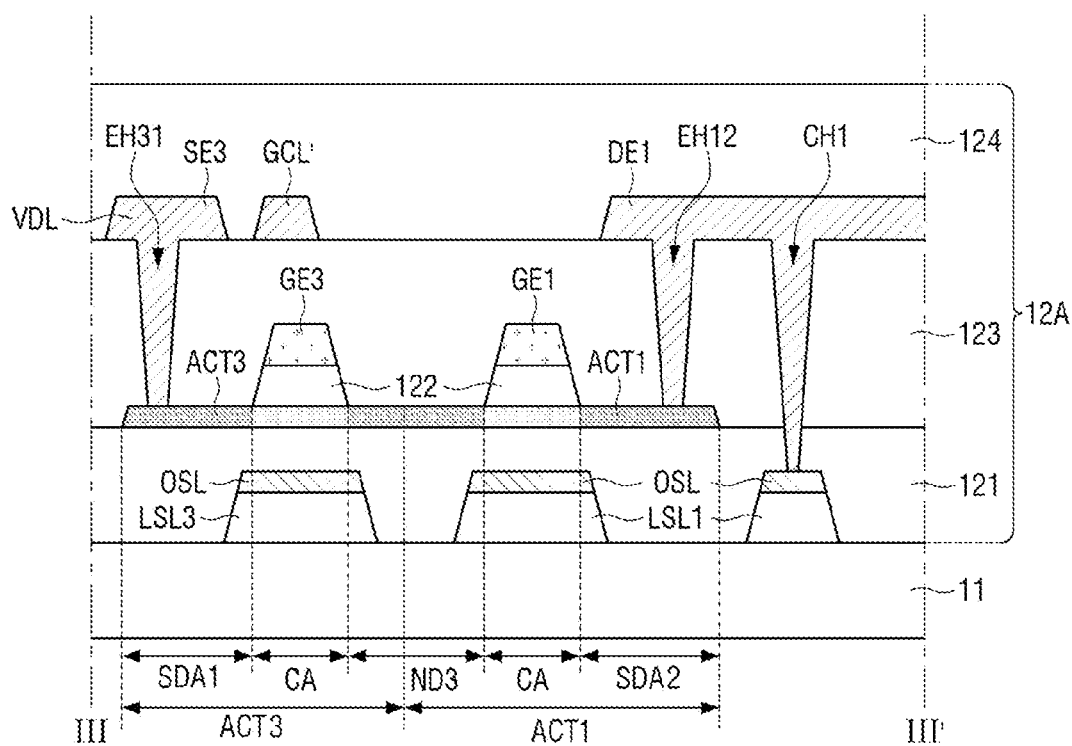
FIG. 12 is a cross-sectional view taken along line III-III' in FIG. 8 according to an embodiment.

FIG. 10 is a cross-sectional view taken along line I-I' in FIG. 8 according to an embodiment. FIG. 11 is a cross-sectional view taken along line II-II' in FIG. 8 according to an embodiment. FIG. 12 is a cross-sectional view taken along line III-III' in FIG. 8 according to an embodiment.

Referring to FIG. 10, in an embodiment, at least one selected from the first thin-film transistor T1, the second thin-film transistor T2, and the third thin-film transistor T3 disposed in each of the pixel areas PX of a circuit array 12A of the thin-film transistor array substrate includes a light-shielding layer (LSL1, LSL2, and LSL3 in FIG. 8 and FIG. 9) disposed on the substrate 11, an oxygen supply layer OSL including or formed of a metal oxide and disposed on the light-shielding layer (LSL1, LSL2, and LSL3 in FIG. 8 and FIG. 9), a buffer layer 121 disposed on the substrate 11 and covering the oxygen supply layer OSL, an active layer (ACT1, ACT2, and ACT3 of FIG. 8 and FIG. 9) disposed on the buffer layer 121 and including a channel area CA overlapping the light-shielding layer (LSL1, LSL2, and LSL3 in FIG. 8 and FIG. 9), and first and second electrode areas SDA1 and SDA2 in contact with both opposing sides of the channel area CA, respectively, a gate insulating layer 122 disposed on the active layer (ACT1, ACT2, and ACT3 of FIG. 8 and FIG. 9) and in the channel area CA, a gate electrode (GE1, GE2, and GE3 in FIG. 8 and FIG. 9) disposed on the gate insulating layer 122, an interlayer insulating layer 123 disposed on the buffer layer 121 and covering the active layer (ACT1, ACT2, and ACT3 of FIG. 8 and FIG. 9) and the gate electrode (GE1, GE2, and GE3 of FIG. 8 and FIG. 9), and a first electrode (DE1, SE2, DE2, and SE3 of FIG. 8 and FIG. 9) disposed on the interlayer insulating layer 123 and connected to the first electrode area SDA1 or SDA2 of the active layer (ACT1, ACT2, and ACT3 of FIG. 8 and FIG. 9) via a first electrode hole (EH12, EH21, EH22, and EH31 of FIG. 8 and FIG. 9) defined through the interlayer insulating layer 123 to overlap or expose a portion of the first electrode area SDA1 or SDA2 of the active layer (ACT1, ACT2, and ACT3 of FIG. 8 and FIG. 9).

In an embodiment, at least one selected from the first thin-film transistor T1, the second thin-film transistor T2 and the third thin-film transistor T3 disposed in each of the pixel areas PX of the circuit array 12A of the thin-film transistor array substrate may further include a second electrode (DE1, SE2, DE2, and SE3 in FIG. 8 and FIG. 9) disposed on the interlayer insulating layer 123 and connected to the second electrode area SDA2 or SDA1 of each of the active layers ACT1, ACT2, and ACT3 via a second electrode hole EH12, EH21, EH22, and EH31 defined through the interlayer insulating layer 123 to overlap or expose a portion of the second electrode area SDA2 or SDA1 of each of the active layers ACT1, ACT2, and ACT3.

In such an embodiment, one of the first and second electrode areas SDA1 and SDA2 may act as a source area SDA1, and the other thereof may act as a drain area SDA2.

The first electrode may act as one of the source electrode and the drain electrode, and the second electrode may act as the other of the source electrode and the drain electrode.

That is, at least one selected from the first thin-film transistor T1, the second thin-film transistor T2, and the third thin-film transistor T3 disposed in each of the pixel areas PX of the circuit array 12A of the thin-film transistor array substrate may include at least one selected from the source electrode and the drain electrode.

The first electrode hole EH12, EH21, EH22, and EH31 may refer to the source electrode hole EH21 and EH31 between the source area SDA1 of the active layer ACT2 and ACT3 and the source electrode SE2 and SE3, or may refer to the drain electrode hole EH12 and EH22 between the drain area SDA2 of the active layer ACT1 and ACT2 and the drain electrode DE1 and DE2.

In an embodiment, referring to FIG. 11, a contact hole (CH1, CH2, and CH3 of FIG. 8 and FIG. 9) may be defined through the interlayer insulating layer 123 and the buffer layer 121 to overlap or expose a portion of the oxygen supply layer OSL in at least one selected from the first thin-film transistor T1, the second thin-film transistor T2, and the third thin-film transistor T3 disposed in each of the pixel areas PX of the circuit array 12A of the thin-film transistor array substrate. The light-shielding layers LSL1, LSL2, and LSL3 may be electrically connected to the gate electrodes GE1, GE2, and GE3 or the first electrodes DE1, SE2, DE2, and SE3 via the contact holes CH1, CH2, and CH3.

In an embodiment, as illustrated in FIG. 10, the second thin-film transistor T2 of the second pixel area PX2 may include the light-shielding layer LSL2 disposed on the substrate 11, the oxygen supply layer OSL including or formed of a metal oxide and disposed on the light-shielding layer LSL2, the active layer ACT2 disposed on the buffer layer 121 covering the oxygen supply layer OSL2 and including the channel area CA, the source area SDA1 and the drain area SDA2, the gate insulating layer 122 disposed on the active layer ACT2 and in the channel area CA, the gate electrode GE2 disposed on the gate insulating layer 122, and the source electrode SE2 disposed on and the interlayer insulating layer 123 covering the gate electrode GE2 and the active layer ACT2 and connected to the source area SDA1 of the active layer ACT2 via the source electrode hole EH21 defined through the interlayer insulating layer 123.

The source electrode SE2 of the second thin-film transistor T2 of the second pixel area PX2 may be composed of or defined by a portion of the second data line GDL.

In an embodiment, the drain electrode hole EH22 defined through the interlayer insulating layer 123 in the second thin-film transistor T2, and the drain electrode DE is disposed on the interlayer insulating layer 123 and connected to the drain area SDA2 of the active layer ACT2 via the drain electrode hole EH22.

The drain electrode DE2 of the second thin-film transistor T2 may be connected to the gate electrode GE1 of the first thin-film transistor T1 via the gate electrode hole EH13 of the first thin-film transistor T1 defined through the interlayer insulating layer 123.

The substrate 11 may include or be formed of an insulating material. In an embodiment, for example, the substrate 11 may include or be formed of an insulating material such as glass, quartz, or polymer resin. In an embodiment, the polymer resin may include polyethersulphone ("PES"), polyacrylate ("PA"), polyarylate ("PAR"), polyetherimide ("PEI"), polyethylene napthalate ("PEN"), polyethylene terepthalate ("PET"), polyphenylene sulfide ("PPS"), poly-allylate, polyimide ("PI"), polycarbonate ("PC"), cellulose triacetate ("CAT"), cellulose acetate propionate ("CAP"), or combinations thereof, for example.

In an embodiment, the substrate 11 may be rigid to firmly support the circuit array 12 and the light-emitting array 13 disposed on the thin-film transistor array substrate 10.

Alternatively, for easy deformation of the display device 1, the substrate 11 may include or be formed of a flexible and soft insulating material that is easily bent, folded, or rolled.

Alternatively, the substrate 11 may include or be formed of a metal material.

The active layer ACT2 may include or be formed of an oxide semiconductor.

In an embodiment, the oxide semiconductor may include at least one metal selected from indium (In), gallium (Ga), zinc (Zn), tin (Sn), titanium (Ti), zirconium (Zr), and hafnium (Hf), and oxygen (O).

The active layer ACT2 includes or is formed of the oxide semiconductor. Thus, the thin-film transistor array substrate 10 may include the light-shielding layer LSL2 and the oxygen supply layer OSL to reduce a difference between threshold voltages of the thin-film transistors.

The light-shielding layer LSL2 may prevent external light from the substrate 11 from entering the active layer ACT2. In an embodiment, where the active layer ACT2 includes or is formed of the oxide semiconductor in which semiconductor characteristic variation is caused by light, threshold voltage variation of the thin-film transistor may be reduced by the light-shielding layer LSL2.

The light-shielding layer LSL2 may be include or formed of a conductive light-shielding material.

The light-shielding layer LSL2 may overlap the channel area CA of the at least active layer ACT2.

The oxygen supply layer OSL may be subjected to a heat treatment process to supply the oxygen to the active layer ACT2 during a manufacturing process, and may include or be formed of a metal oxide.

In a process of providing the gate insulating layer 122 on the channel area CA of the active layer ACT2, oxygen defects may be generated in the active layer ACT2, such that the semiconductor characteristic of the active layer ACT2 may be deteriorated. Accordingly, excessive oxygen may be injected into the buffer layer 121 through the oxygen supply layer OSL to prevent deterioration of the semiconductor characteristic of the active layer ACT2 during the process of providing the gate insulating layer 122 on the channel area CA of the active layer ACT2. When the heat treatment is performed thereon, oxygen of the buffer layer 121 may be supplied to the active layer ACT2.

Accordingly, in such an embodiment, the threshold voltage characteristic of the thin-film transistor may be improved, so that reliability of the thin-film transistor may be improved. In such an embodiment, uniformity of the threshold voltage characteristics of the plurality of thin-film transistors may be improved, and uniformity of the luminance characteristics of the plurality of pixel areas PX may be improved.

The oxygen supply layer OSL may include or be formed of a metal oxide including at least one selected from indium (In), gallium (Ga), zinc (Zn), tin (Sn), titanium (Ti), zirconium (Zr), and hafnium (Hf). In an embodiment, for example, the oxygen supply layer OSL may include or be formed of a same material as that of the active layer ACT2. In an embodiment, for example, the oxygen supply layer OSL and the active layer ACT2 may be formed of In—Ga—Zn—O ("IGZO").

The oxygen supply layer OSL may be formed using a same mask process in which the light-shielding layer LSL2 is formed, so that the oxygen supply layer OSL may have a planar shape similar to that of the light-shielding layer LSL2 and may be disposed on the light-shielding layer LSL2.

The buffer layer 121 is disposed over an entire surface of the substrate 11 and covers the oxygen supply layer OSL and the light-shielding layer LSL2. The buffer layer 121 may be composed of or defined by a single layer including or formed of at least one of silicon nitride, silicon oxide, and silicon oxynitride or multi-layers including or formed of at least one selected from silicon nitride, silicon oxide, and silicon oxynitride.

The active layer ACT2 includes the channel area CA where the channel is generated, and the source area SDA1 and the drain area SDA2 in contact with both opposing sides of the channel area CA, respectively. The channel of the channel area CA may correspond to a difference between a voltage of one of the source area SDA1 and the drain area SDA2 and a voltage of the channel area CA.

The gate insulating layer 122 is disposed at least in the channel area CA and on the active layer ACT2.

The gate insulating layer 122 may be formed using a same mask process in which the gate electrode GE2 to be described later is formed. Thus, the gate insulating layer 122 may be disposed under the gate electrode GE2 while having a planar shape similar to that of the gate electrode GE2.

The gate insulating layer 122 may include a silicon compound, a metal oxide, etc. In an embodiment, for example, the gate insulating layer 122 may include at least one selected from silicon oxide, silicon nitride, silicon oxynitride, aluminum oxide, tantalum oxide, hafnium oxide, zirconium oxide, titanium oxide, and the like.

The gate electrode GE2 is disposed on the gate insulating layer 122.

The gate electrode GE2 may be composed of or defined by a single layer or multi-layers, each layer including at least one selected from silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), and mixtures thereof.

Alternatively, the gate electrode GE2 may further include a layer including or formed of a material with a high work function such as indium-tin-oxide ("ITO"), indium-zinc-oxide ("IZO"), zinc oxide (ZnO), indium oxide ($In_2O_3$), etc.

The interlayer insulating layer 123 is disposed on an entire surface of the buffer layer 121 and covers the active layer ACT2 and the gate electrode GE2.

The interlayer insulating layer 123 may include or be formed of an inorganic insulating material such as silicon oxide, silicon nitride, silicon oxynitride, hafnium oxide, aluminum oxide, titanium oxide, tantalum oxide, or zinc oxide.

The second thin-film transistor T2 of the second pixel area PX2 may include the source electrode SE2 and the drain electrode DE2 disposed on the interlayer insulating layer 123.

The source electrode SE2 may be connected to the source area SDA1 of the active layer ACT2 via the source electrode hole EH21 defined through the interlayer insulating layer 123.

The source electrode SE2 of the second thin-film transistor T2 of the second pixel area PX2 may be composed of or defined by a portion of the second data line GDL.

The drain electrode DE2 may be connected to the drain area SDA2 of the active layer ACT2 via the drain electrode hole EH22 defined through the interlayer insulating layer 123.

The drain electrode DE2 of the second thin-film transistor T2 may be connected to the gate electrode GE1 of the first thin-film transistor T1 via the gate electrode hole EH13 of the first thin-film transistor T1 defined through the interlayer insulating layer 123.

Each of the source electrode SE2 and the drain electrode DE2 may include or be formed of at least one selected from silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), and mixtures thereof.

In an embodiment, the circuit array 12A may further include a transistor protective layer 124 disposed on the interlayer insulating layer 123 and covering the source electrode SE2 and the drain electrode DE2.

Referring to FIG. 11, in the second thin-film transistor T2, the gate electrode hole EH23 may be defined through the interlayer insulating layer 123 to overlap or expose a portion of the gate electrode GE2, the contact hole CH2 may be defined through the interlayer insulating layer 123 and the buffer layer 121 to overlap or expose a portion of the oxygen supply layer OSL, and the connective pattern CNP is disposed to connect the gate electrode hole EH23 and the contact hole CH2 to each other.

In such an embodiment, the light-shielding layer LSL2 of the second thin-film transistor T2 may be connected to the gate electrode GE2 via the gate electrode hole EH23, the connective pattern CNP, the contact hole CH2, and the oxygen supply layer OSL. Accordingly, the light-shielding layer LSL2 of the second thin-film transistor T2 may function as an auxiliary gate electrode having a same voltage level as that of the gate electrode GE2.

In an embodiment, like the light-shielding layer LSL2 of the second thin-film transistor T2, the light-shielding layer LSL3 of the third thin-film transistor T3 may function as an auxiliary gate electrode having a same voltage level as that of the gate electrode GE3 of the third thin-film transistor T3.

In an embodiment, referring to FIG. 8, in the third thin-film transistor T3, the contact hole CH3 is defined in an overlapping area between the light-shielding layer LSL3 and the auxiliary global control line GCL'. The light-shielding layer LSL3 may be connected to the auxiliary global control line GCL' via the contact hole CH3. The gate electrode GE3 of the third thin-film transistor T3 is composed of or defined by a portion of a pattern branching from the global control line GCL, and the auxiliary global control line GCL' is connected to the global control line GCL via the line hole LH. Accordingly, both the gate electrode GE3 and the light-shielding layer LSL3 of the third thin-film transistor T3 may be connected to the global control line GCL and receive the global control signal therefrom, so that the light-shielding layer LSL3 of the third thin-film transistor T3 may function as an auxiliary gate electrode having a same voltage level as that of the gate electrode GE3 of the third thin-film transistor T3.

Referring to FIG. 12, the first thin-film transistor T1 is substantially the same as the second thin-film transistor T2 shown in FIG. 10 and FIG. 11 except that the source area of the active layer ACT1 thereof is in contact with the active layer ACT3 of the third thin-film transistor T3 to implement the third node ND3, and the drain electrode DE1 thereof is connected to the light-shielding layer LSL1 via the contact hole CH1 defined through the interlayer insulating and the buffer layer 121, and the oxygen supply layer OSL. Thus, any repetitive detailed descriptions thereof will be omitted.

Referring to FIG. 12, the third thin-film transistor T3 is substantially the same as the second thin-film transistor T2 shown in FIG. 10 and FIG. 11 except that the drain area of the active layer ACT3 thereof is in contact with the active layer ACT1 of the first thin-film transistor T1 to implement the third node ND3, and the source electrode SE3 is composed of a portion of the first drive power line VDL. Thus, any repetitive detailed descriptions thereof will be omitted.

In an embodiment, as described above with reference to FIGS. 8, 10, 11 and 12, each of the first, second and third thin-film transistors T1, T2, and T3 includes the oxygen supply layer OSL disposed on each of the light-shielding layers LSL1, LSL2, and LSL3. Thus, the heat treatment of the oxygen supply layer may allow the semiconductor characteristics of the active layers ACT1, ACT2, and ACT3 formed of the oxide semiconductor to be improved. As a result, the threshold voltage characteristics of the thin-film transistors T1, T2, and T3 may be uniform, so that the luminance control of the plurality of pixel areas PX may be easily controlled, and thus the display quality of the display device 1 may be improved.

Figure 13:
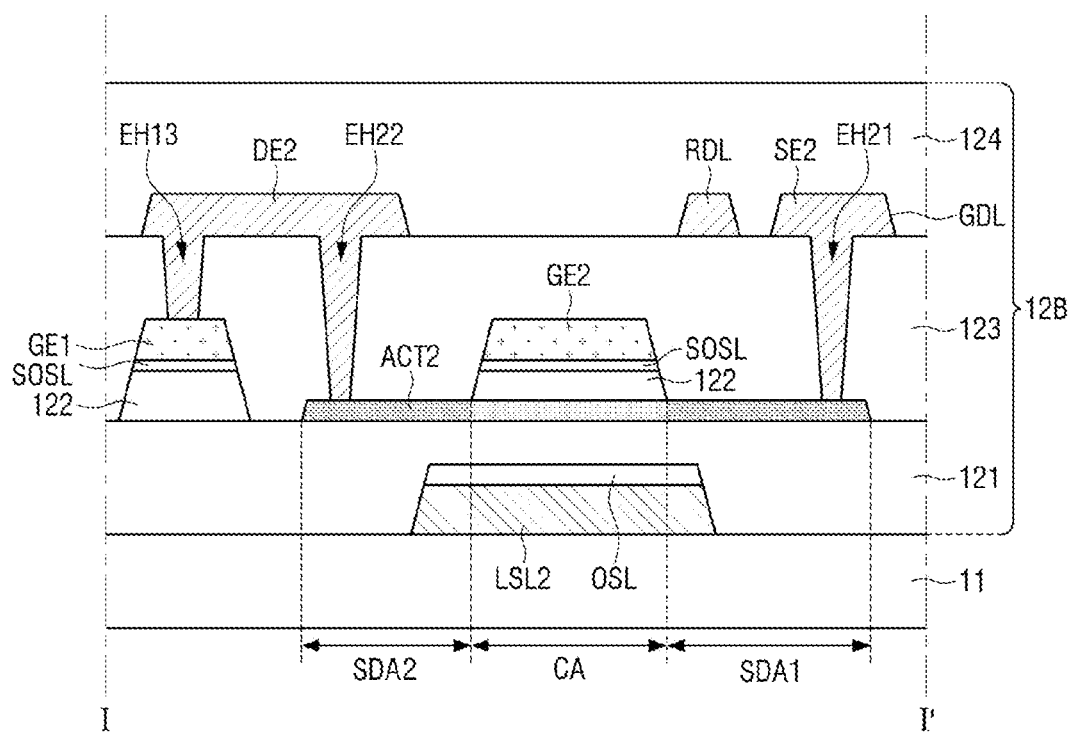
FIG. 13 is a cross-sectional view taken along line I-I' in FIG. 8 according to an alternative embodiment.
Figure 14:
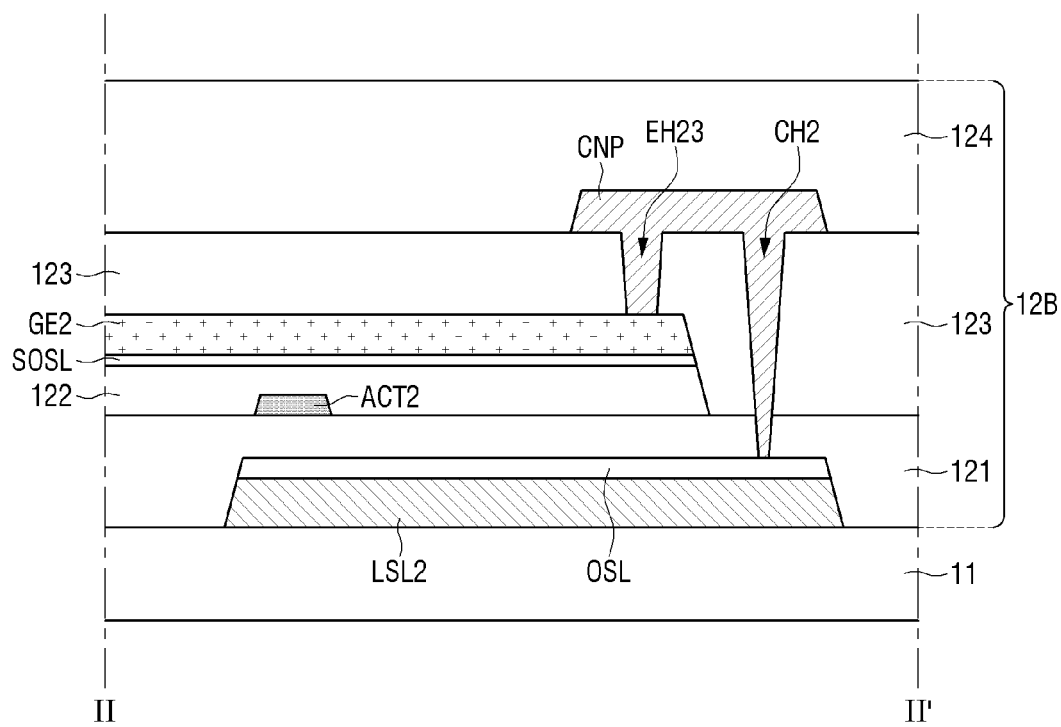
FIG. 14 is a cross-sectional view taken along line II-II' in FIG. 8 according to an alternative embodiment.
Figure 15:
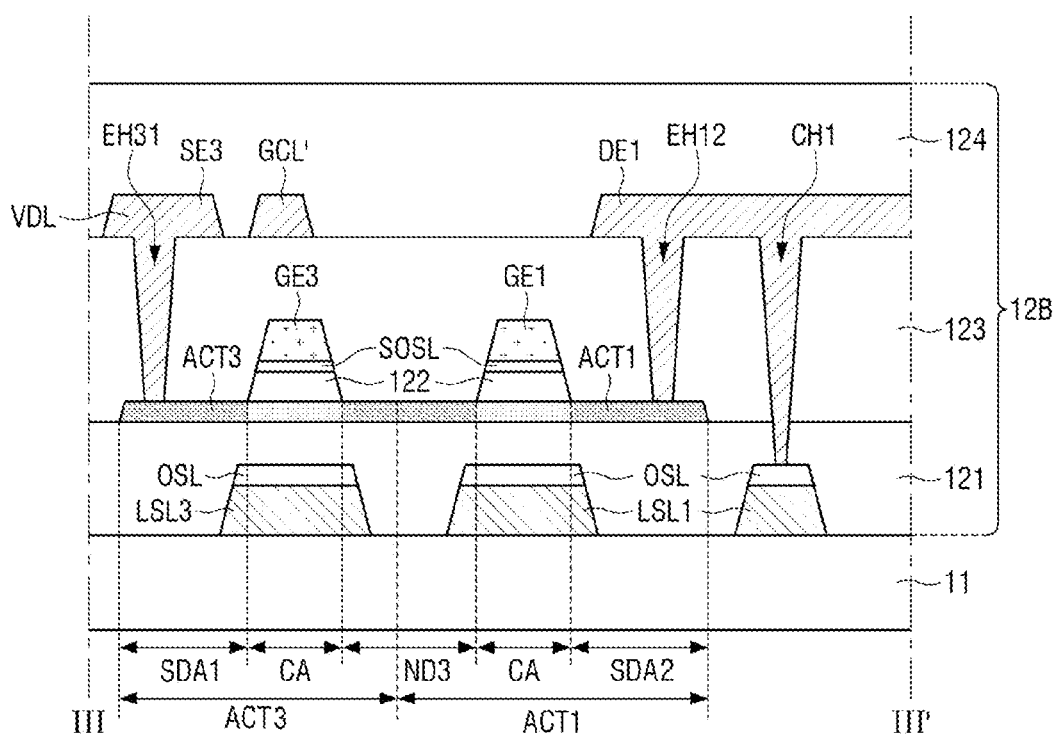
FIG. 15 is a cross-sectional view taken along line III-III' in FIG. 8 according to an alternative embodiment.

FIG. 13 is a cross-sectional view taken along line I-I' in FIG. 8 according to an alternative embodiment. FIG. 14 is a cross-sectional view taken along line II-II' in FIG. 8 according to an embodiment. FIG. 15 is a cross-sectional view taken along line III-III' in FIG. 8 according to an alternative embodiment.

In an embodiment of FIG. 13, FIG. 14 and FIG. 15, each of the first, second and third thin-film transistors T1, T2, and T3 disposed in a circuit array 12B of the thin-film transistor array substrate 10 is substantially the same as that in the embodiment described above with reference to FIG. 10, FIG. 11 and FIG. 12 except that each of the first, second and third thin-film transistors T1, T2, and T3 further includes an auxiliary oxygen supply layer SOSL disposed between each of the gate electrodes GE1, GE2, and GE3 and the gate insulating layer 122, where the auxiliary oxygen supply layer SOSL includes or is formed of a metal oxide. Thus, any repetitive detailed descriptions of the same or like elements in the embodiment of FIG. 13, FIG. 14 and FIG. 15 as those described above with reference to FIG. 10, FIG. 11 and FIG. 12 will hereinafter be omitted below.

According to an embodiment, as shown in FIG. 13, FIG. 14 and FIG. 15, the auxiliary oxygen supply layer SOSL and the oxygen supply layer OSL are respectively disposed above and below each of the active layers ACT1, ACT2, and ACT3. Thus, during the heat treatment process, the oxygen may be supplied to a top surface and a bottom surface of each of the active layers ACT1, ACT2, and ACT3.

Accordingly, sufficient oxygen supply to the active layers ACT1, ACT2, and ACT3 may be carried out. Thus, the semiconductor characteristics in upper and lower portions of the channel area CA may be maintained to be uniform. Therefore, the threshold voltage characteristics of the thin-film transistors T1, T2, and T3 may be further uniform.

Figure 16:
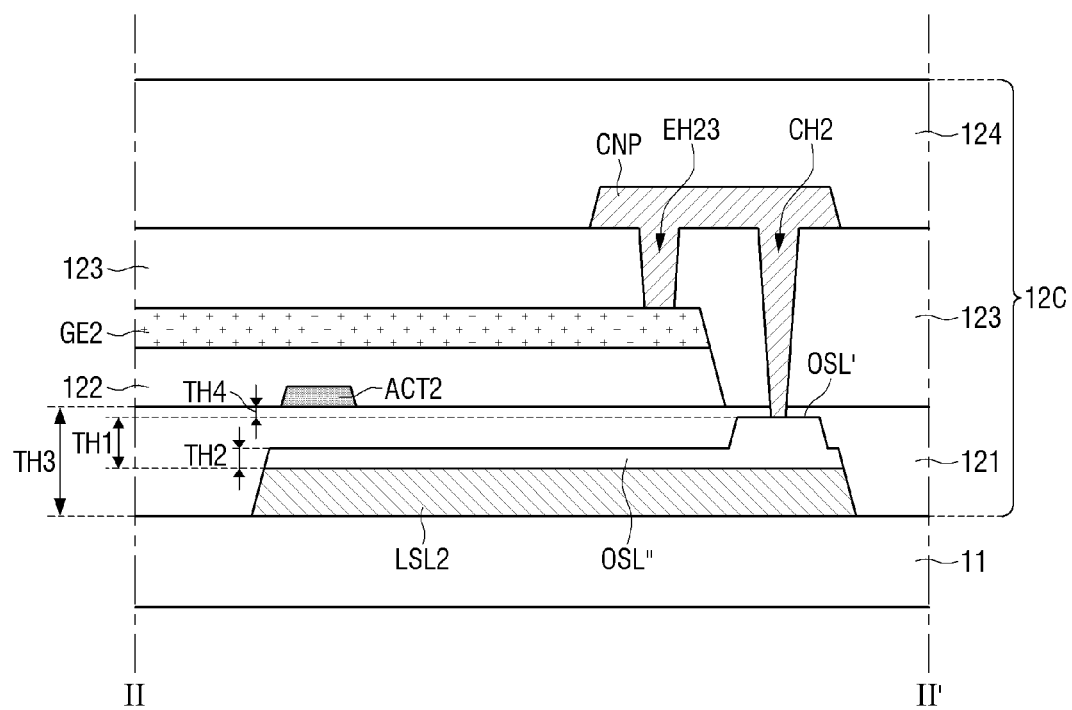
FIG. 16 is a cross-sectional view taken along line II-II' in FIG. 8 according to another alternative embodiment.
Figure 17:
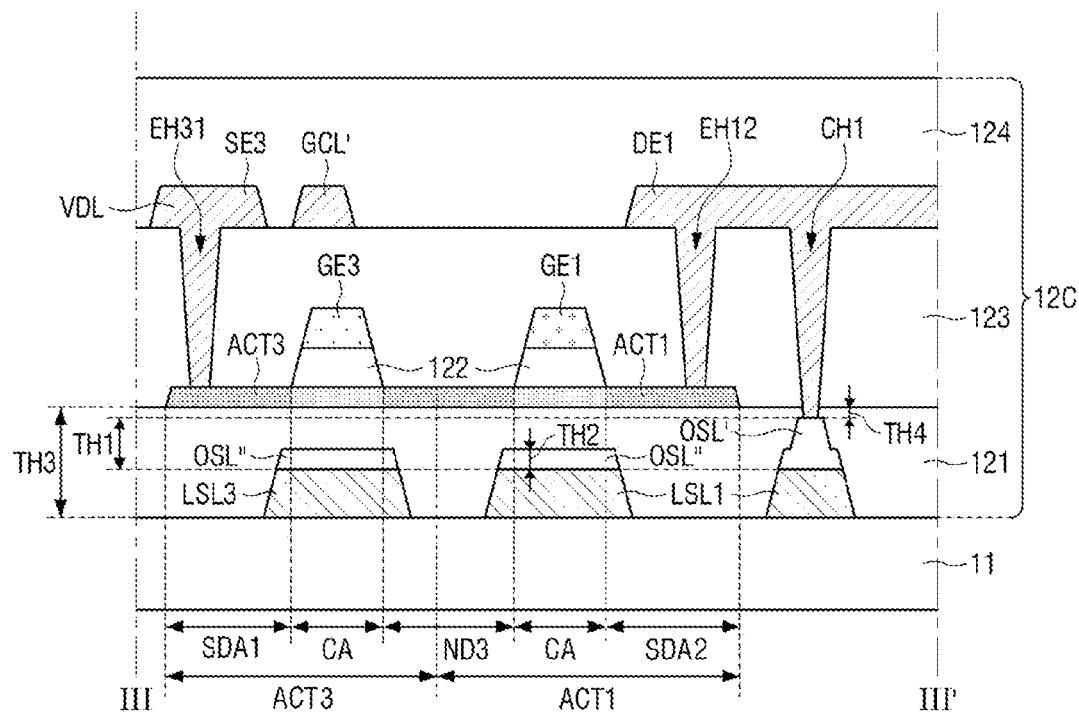
FIG. 17 is a cross-sectional view taken along line III-III' in FIG. 8 according to another alternative embodiment.

FIG. 16 is a cross-sectional view taken along line II-II' in FIG. 8 according to another alternative embodiment. FIG. 17 is a cross-sectional view taken along line in FIG. 8 according to another alternative embodiment.

In an embodiment of FIG. 16 and FIG. 17, each of the first, second and third thin-film transistors T1, T2, and T3 disposed in a circuit array 12C of the thin-film transistor array substrate 10 is substantially the same as that in the embodiment described above with reference to FIG. 10, and FIG. 11 and FIG. 12 except that the oxygen supply layer OSL' and OSL" has portions of different thicknesses from each other. Thus, any repetitive detailed descriptions of the same or like elements in the embodiment of FIG. 16 and FIG. 17 as those described above with reference to FIG. 10, FIG. 11 and FIG. 12 will hereinafter be omitted.

According to an embodiment, as shown in FIG. 16 and FIG. 17, a portion OSL' of the oxygen supply layer disposed on each of the light-shielding layers LSL1, LSL2, and LSL3 and corresponding to each of the contact holes CH1, CH2, and CH3 has a first thickness TH1, and a remaining portion OSL" thereof has a second thickness TH2 smaller than the first thickness TH1.

The buffer layer 121 is disposed on the substrate 11 such that a top surface thereof is planarized. The buffer layer covers the oxygen supply layer OSL' and OSL".

Accordingly, in such an embodiment where a portion of the buffer layer 121 in contact with the substrate 11 has a third thickness TH3, the third thickness TH3 of the buffer layer 121 is greater than a sum of the first thickness TH1 of the oxygen supply layer OSL' and a thickness of the light-shielding layer LSL2.

In such an embodiment, another portion of the buffer layer 121 covering the oxygen supply layer OSL' of the first thickness TH1 may have a fourth thickness TH4 exceeding 0 and smaller than the third thickness TH3. In an embodiment, for example, the sum of the fourth thickness TH4 of the buffer layer 121 and a thickness of the active layer ACT2 may be about 300 angstrom (Å) or smaller.

In such an embodiment, the fourth thickness TH4 of the portion of the buffer layer 121 corresponding to each of the contact holes CH1, CH2, and CH3 is small. Thus, even when each of the contact holes CH1, CH2 and CH3 defined through the interlayer insulating layer 123 and the buffer layer 121 and each of the source electrode holes EH21 and EH31, the drain electrode holes EH12 and EH22 and the gate electrode holes EH13 and EH23 defined through the interlayer insulating layer 123 are formed in a same etching process, a probability that each of the active layers ACT1, ACT2, and ACT3 is damaged due to excessive etching may be lowered.

As described above, according to an embodiment, even when each of the contact holes CH1, CH2, and CH3 defined through the interlayer insulating layer 123 and the buffer layer 121 and each of the source electrode holes EH21 and EH31, the drain electrode holes EH12 and EH22 and the gate electrode holes EH13 and EH23 defined through the interlayer insulating layer 123 are formed in a same etching process, the damage to each of the active layers ACT1, ACT2, and ACT3 due to the excessive etching may be prevented such that a method for manufacturing the thin film transistor may be simplified.

Next, a method for manufacturing a thin-film transistor according to embodiments will be described.

Figure 18:
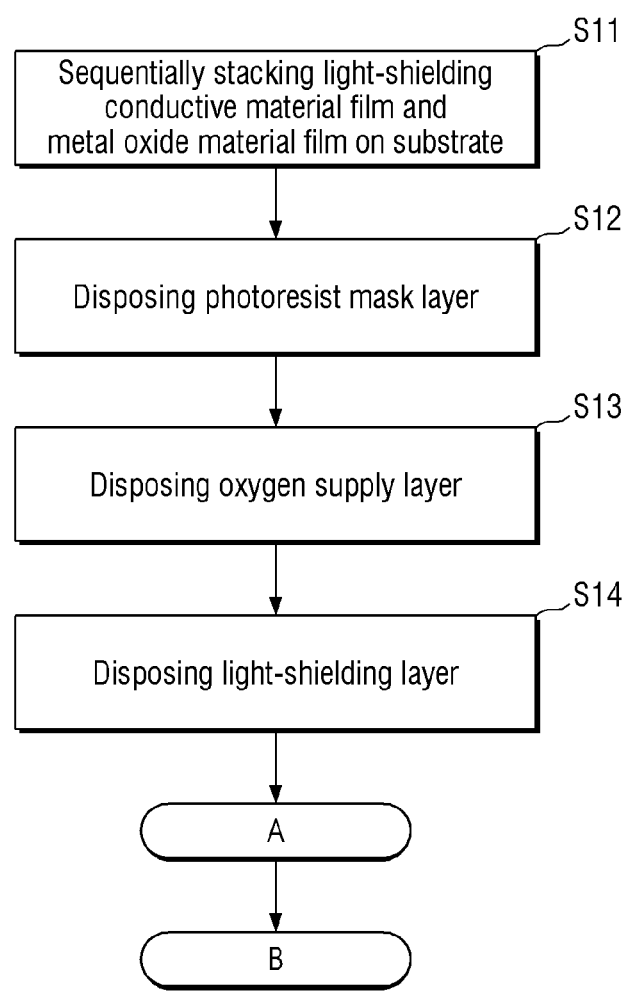
FIG. 18 and FIG. 19 are flowcharts showing a method for manufacturing a thin-film transistor according to an embodiment.
Figure 19:
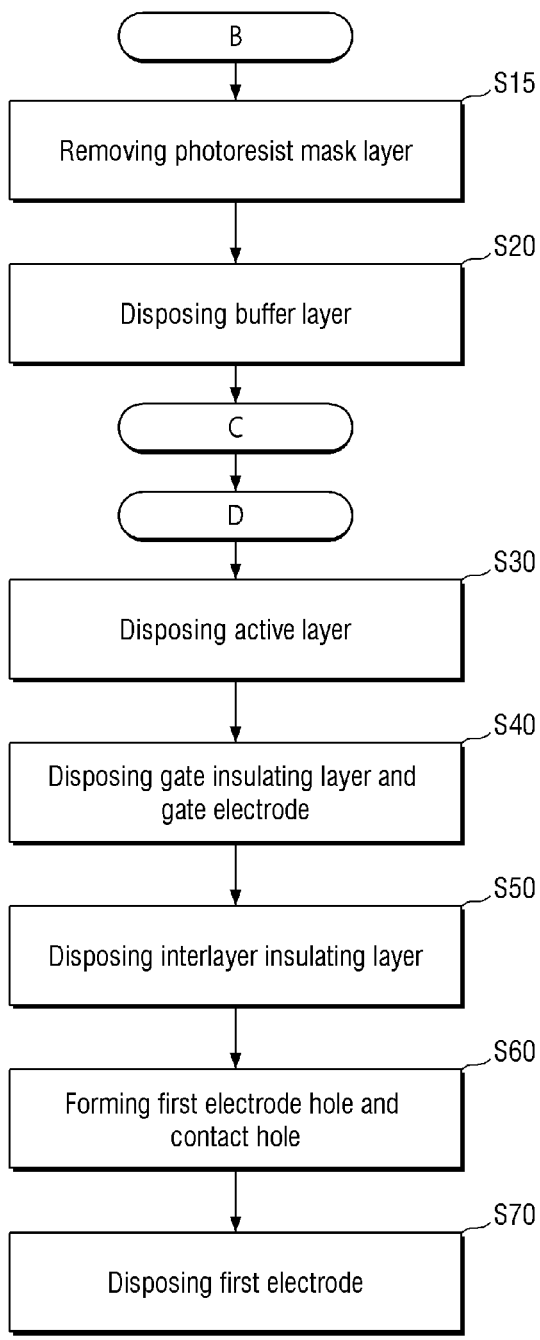

FIG. 18 and FIG. 19 are flowcharts showing a method for manufacturing a thin-film transistor according to an embodiment. FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34 and FIG. 35 are cross-sectional views showing processes of FIG. 18 and FIG. 19. More particularly, FIG. 18 and FIG. 19 are flowcharts showing an embodiment of a method for manufacturing a thin-film transistor of FIG. 8, FIG. 10, FIG. 11 and FIG. 12.

Referring to FIG. 18 and FIG. 19, an embodiment of the method for manufacturing the thin-film transistor may include a process S11 of sequentially stacking (or providing) a light-shielding conductive material film and a metal oxide material film on the substrate 11, a process S12 of disposing (or providing or depositing) a photoresist mask layer on the metal oxide material film 202, a process S13 of disposing (or forming) the oxygen supply layer OSL by patterning the metal oxide material film 202 using the photoresist mask layer disposed thereon, a process S14 of disposing (or forming) each of the light-shielding layers LSL1, LSL2, and LSL3 by patterning the light-shielding conductive material film 201 while maintaining the photoresist mask layer 301, a process S15 of removing the photoresist mask layer, a process S20 of disposing (or providing) the buffer layer 121 covering the oxygen supply layer OSL on the substrate 11, a process S30 of disposing (or forming) each of the active layers ACT1, ACT2, and ACT3 including the channel area CA and the first and second electrode areas SDA1 and SDA2 in contact with both opposing sides of the channel area CA, respectively, by patterning a semiconductor material film on the buffer layer 121, a process S40 of disposing (or forming) the gate insulating layer 122 and each of the gate electrodes GE, GE2, and GE3 which overlaps the channel area CA of each of the active layers ACT1, ACT2, and ACT3, and are sequentially stacked, by patterning an insulating material film covering each of the active layers ACT1, ACT2, and ACT3 and a first conductive material film on the insulating material film, a process S50 of disposing (or providing) the interlayer insulating layer 123 covering each of the active layers ACT1, ACT2, and ACT3 and each of the gate electrodes GE1, GE2, and GE3 on the buffer layer 121, a process S60 of forming each of the first electrode holes EH21, EH31, EH12, and EH22 corresponding to a portion of each of the active layers ACT1, ACT2, and ACT3 and each of the contact holes CH1, CH2 and CH3 corresponding to a portion of the oxygen supply layer OSL by patterning the interlayer insulating layer 123 and the buffer layer 121, and a process S70 of disposing (or forming) each of the first electrodes DE1, SE2, DE2, and SE3 connected to each of the active layers ACT1, ACT2, and ACT3 via each of the first electrode holes EH21, EH31, EH12, and EH22 by patterning a second conductive material film on the interlayer insulating layer 123.

Figure 20:
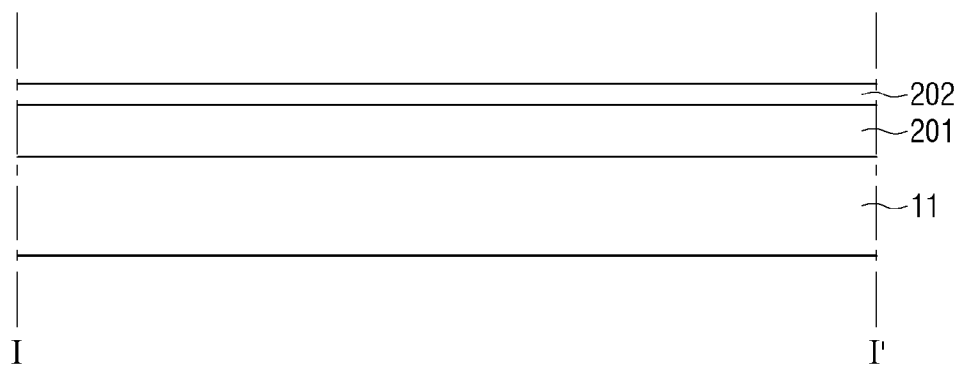
FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34 and FIG. 35 cross-sectional views showing processes of FIG. 18 and FIG. 19.

Referring to FIG. 20, the substrate 11 including the display area is prepared. Then, the process S11 of sequentially stacking the light-shielding conductive material film 201 and the metal oxide material film 202 on one surface of the substrate 11 is performed.

In an embodiment, for example, the light-shielding conductive material film 201 may include or be formed of a metal material.

The metal oxide material film 202 may include or be formed of a metal oxide including at least one selected from indium (In), gallium (Ga), zinc (Zn), tin (Sn), titanium (Ti), zirconium (Zr), and hafnium (Hf). In an embodiment, for example, the metal oxide material film 202 may include or be formed of IGZO.

Figure 21:
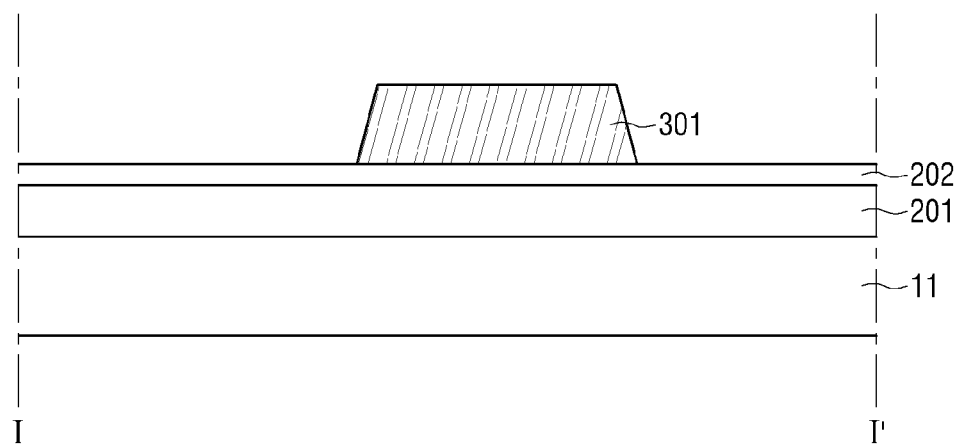

Referring to FIG. 21, the process S12 of disposing the photoresist mask layer 301 on the metal oxide material film 202 is performed.

The photoresist mask layer 301 may include or be formed of a material having a relatively low etch rate. The photoresist mask layer 301 may include or be formed of a photoreactive material which is cured in an amount varying depending on an exposure amount to light.

Figure 22:
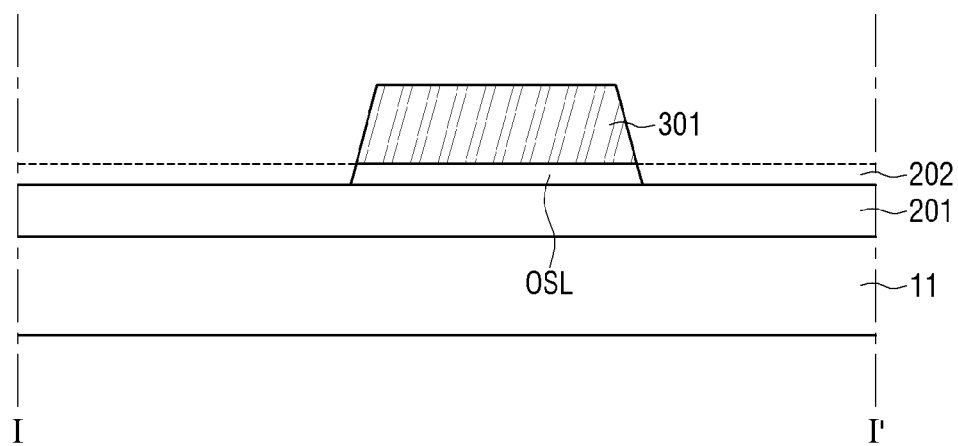

Referring to FIG. 22, the process S13 is performed to pattern the metal oxide material film 202 in a state where the photoresist mask layer 301 is disposed thereon to prepare the oxygen supply layer OSL.

In an embodiment, the patterning of the metal oxide material film 202 may be performed using wet etching.

In an embodiment, the patterning of the metal oxide material film 202 may allow a remaining portion of the metal oxide material film 202 except for a portion thereof corresponding to the photoresist mask layer 301 to be removed using wet etching. Thus, the oxygen supply layer OSL composed of or defined by the portion thereof corresponding to the photoresist mask layer 301 may be formed.

Figure 23:
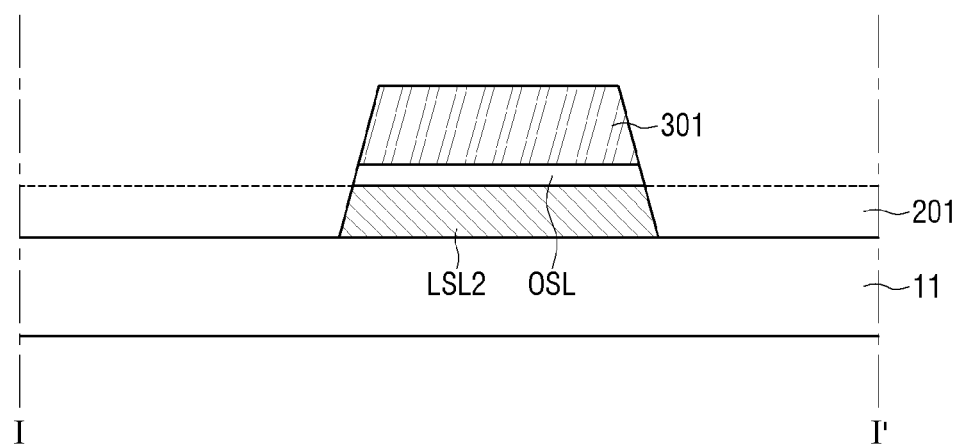

Referring to FIG. 23, the process S14 of preparing each of the light-shielding layers LSL1, LSL2, and LSL3 by patterning the light-shielding conductive material film 201 while maintaining the photoresist mask layer 301 is performed.

In an embodiment, the patterning of the light-shielding conductive material film 201 may be performed using dry etching.

In an embodiment, the patterning of the light-shielding conductive material film 201 may allow the remainder of the light-shielding conductive material film 201 except for a portion thereof corresponding to the photoresist mask layer 301 to be removed using the dry etching, so that each of the light-shielding layers LSL1, LSL2, and LSL3 composed of the portion thereof corresponding to the photoresist mask layer 301 may be provided.

Figure 24:
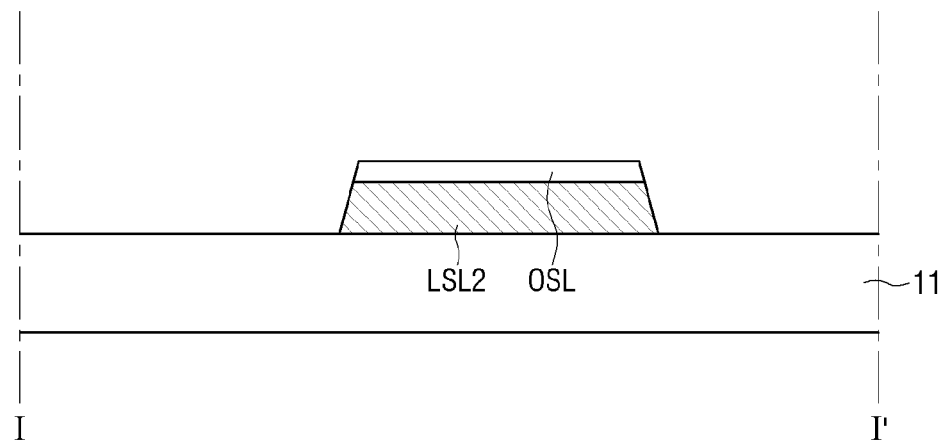

Then, referring to FIG. 24, the process S15 of removing the photoresist mask layer 301 is performed.

Figure 25:
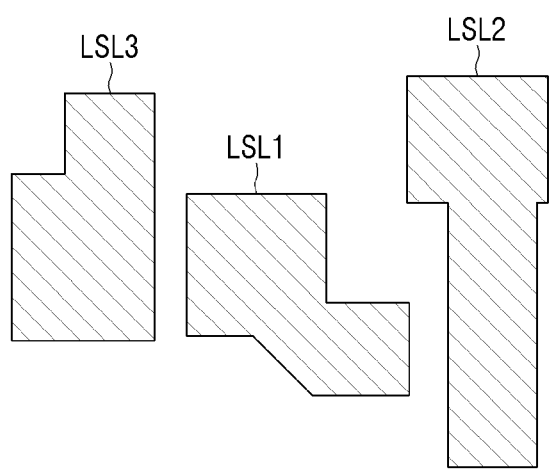
Figure 25:
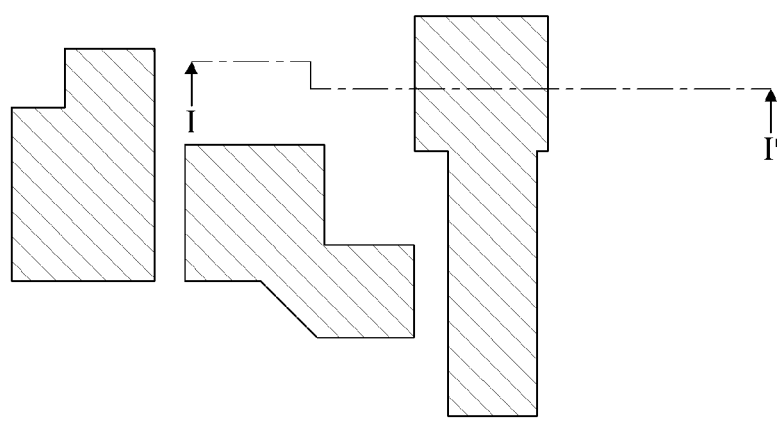

Thus, as shown in FIG. 24 and FIG. 25, each of the light-shielding layers LSL1, LSL2, and LSL3 and the oxygen supply layer OSL on each of the light-shielding layers LSL1, LSL2, and LSL3 of each of the first, second and third thin-film transistors T1, T2, and T3 are prepared.

Figure 26:
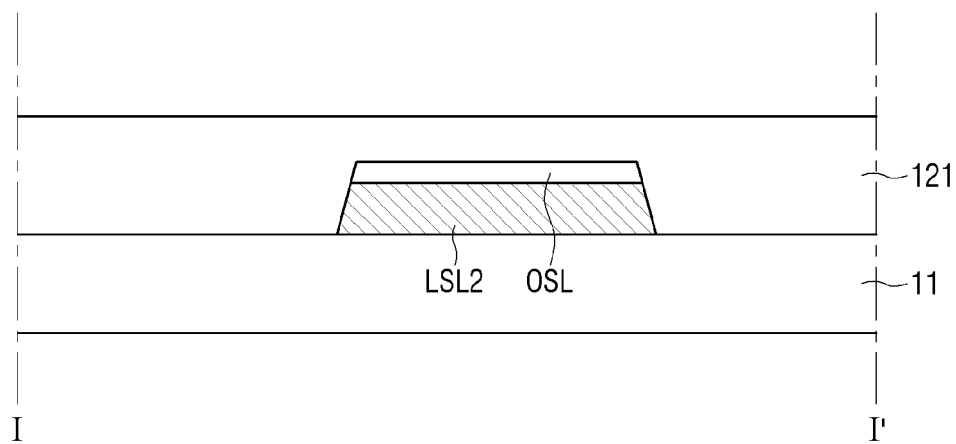

Referring to FIG. 26, the process S20 of applying an insulating material film on the substrate 11 to form the buffer layer 121 covering the oxygen supply layer OSL is performed.

The buffer layer 121 may be composed of or defined by a single layer or multi-layers, each layer therein including or formed of at least one selected from silicon nitride, silicon oxide, and silicon oxynitride.

Figure 27:
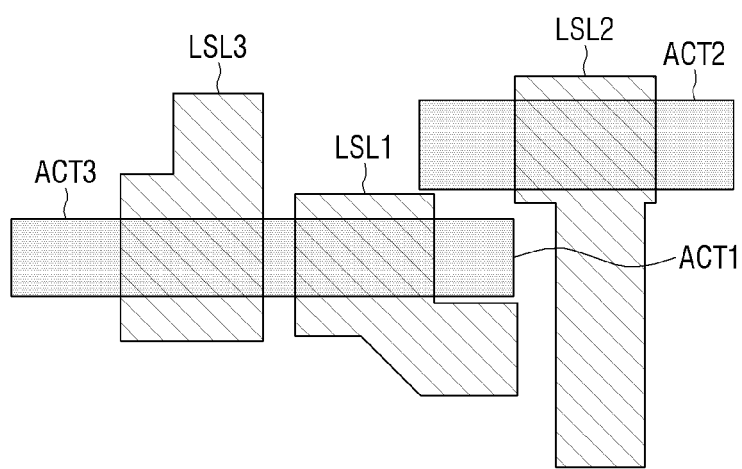
Figure 27:
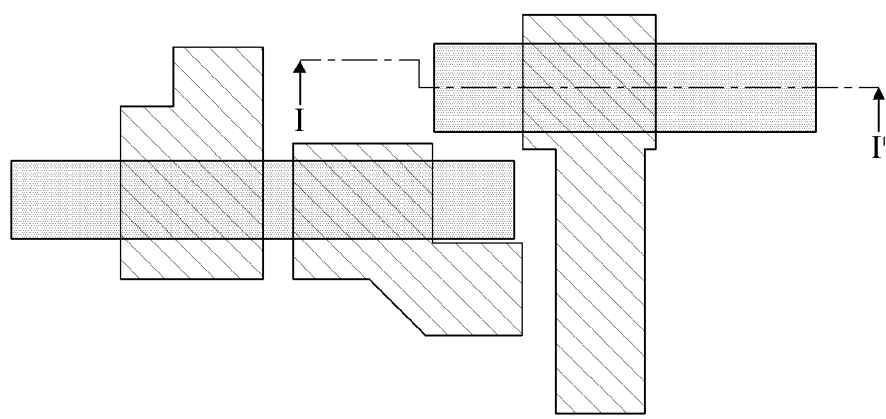
Figure 28:
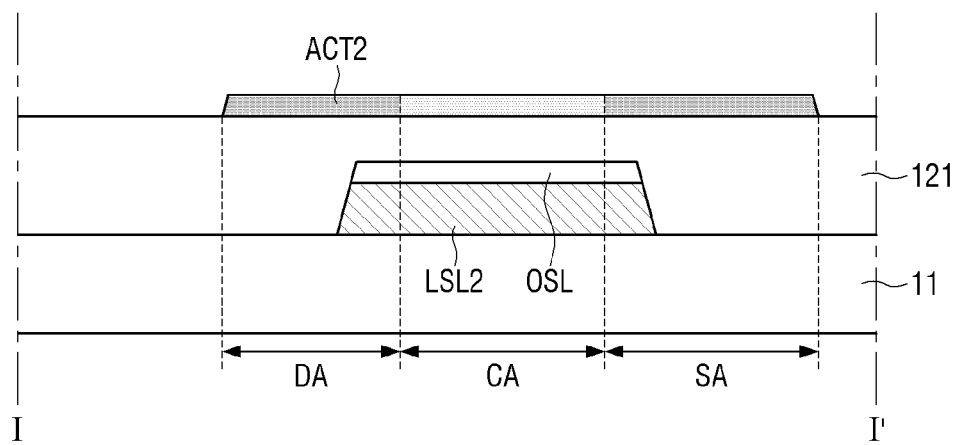

Referring to FIG. 27 and FIG. 28, the process S30 of patterning the semiconductor material film (not shown) on the buffer layer 121 to form each of the active layers ACT1, ACT2, and ACT3 of each of the first, second and third thin-film transistors T1, T2, and T3 is performed.

Each of the active layers ACT1, ACT2, and ACT3 may include or be formed of an oxide semiconductor including at least one selected from indium (In), gallium (Ga), zinc (Zn), tin (Sn), titanium (Ti), zirconium (Zr), and hafnium (Hf). In an embodiment, for example, each of the active layers ACT1, ACT2, and ACT3 may include or be formed of IGZO. Each of the active layers ACT1, ACT2, and ACT3 may be formed of a same material as that of the oxygen supply layer OSL.

Figure 29:
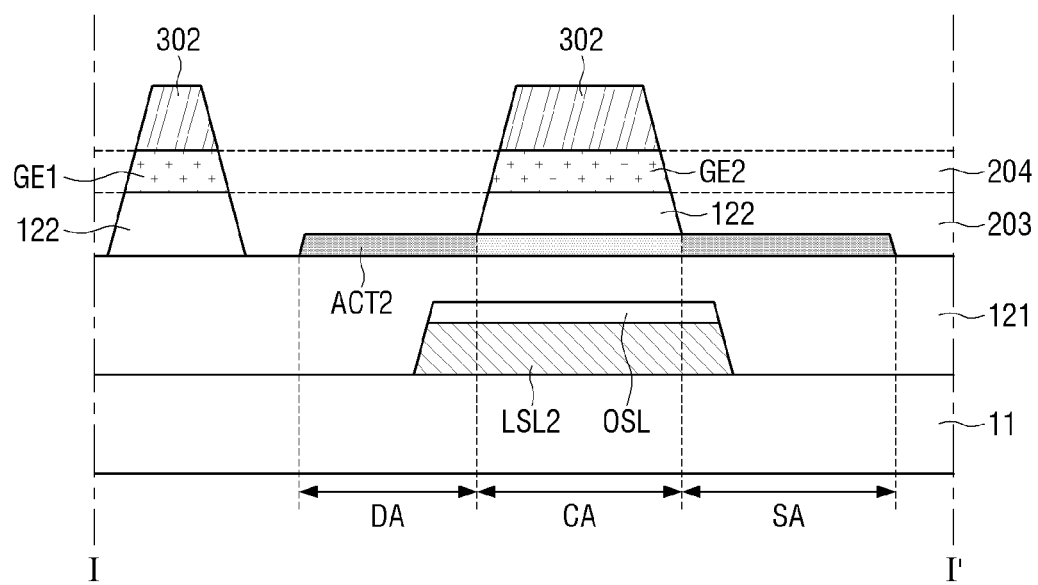
Figure 30:
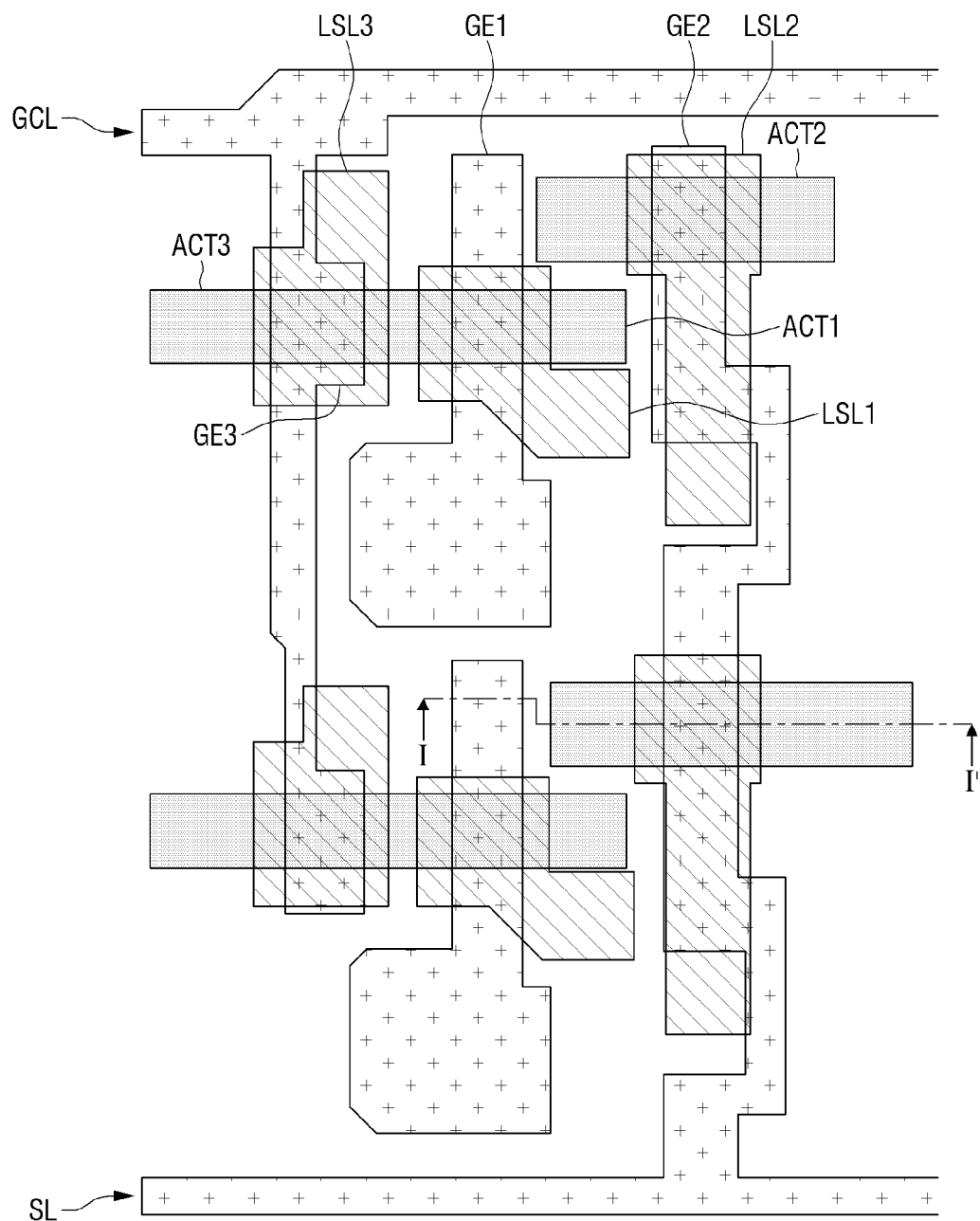

Referring to FIG. 29 and FIG. 30, the process S40 of patterning the insulating material film 203 covering each of the active layers ACT1, ACT2, and ACT3 and the first conductive material film 204 on the insulating material film 203 to form the gate insulating layer 122 and each of the gate electrodes GE1, GE2, and GE3 is performed.

The insulating material film 203 and the first conductive material film 204 may be patterned based on a photomask 302 at the same time. Accordingly, the gate insulating layer 122 and each of the gate electrodes GE1, GE2, and GE3 may have a similar planar shape as each other.

The gate insulating layer 122 may be composed of or defined by a single layer or multi-layers, each layer therein including or formed of at least one selected from silicon nitride, silicon oxide, and silicon oxynitride.

Each of the gate electrodes GE1, GE2, and GE3 are insulated from each of the active layers ACT1, ACT2, and ACT3 via the gate insulating layer 122, and overlaps with the channel area CA of each of the active layers ACT1, ACT2, and ACT3.

Figure 31:
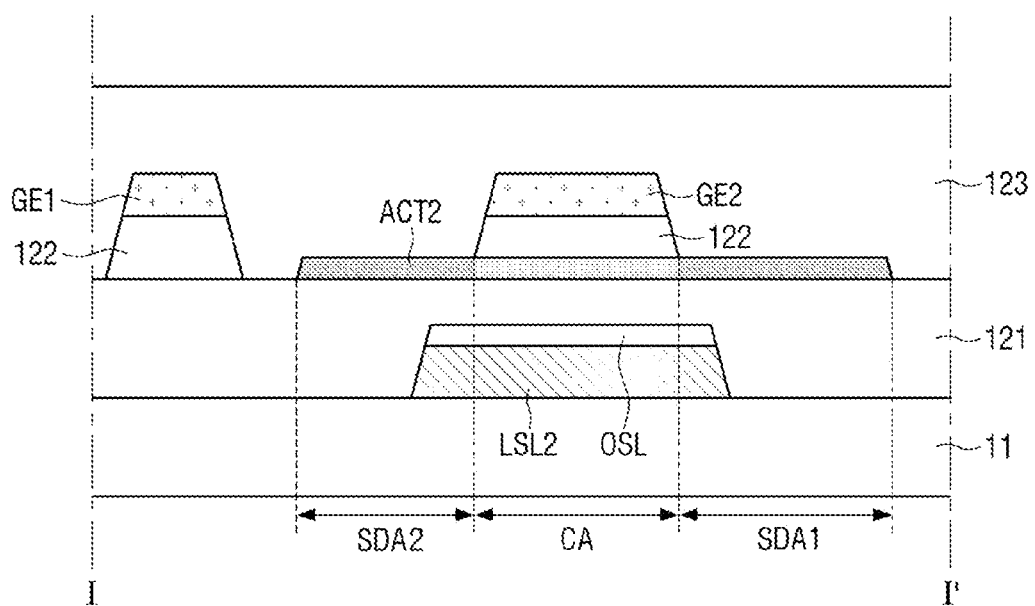

Referring to FIG. 31, the process S50 of applying the insulating material film on the buffer layer 121 to form the interlayer insulating layer 123 covering each of the active layers ACT1, ACT2, and ACT3 and each of the gate electrodes GE1, GE2, and GE3 is performed.

The interlayer insulating layer 123 may be composed of or defined by a single layer or multi-layers, each layer therein including or formed of an inorganic insulating material or an organic insulating material.

Figure 32:
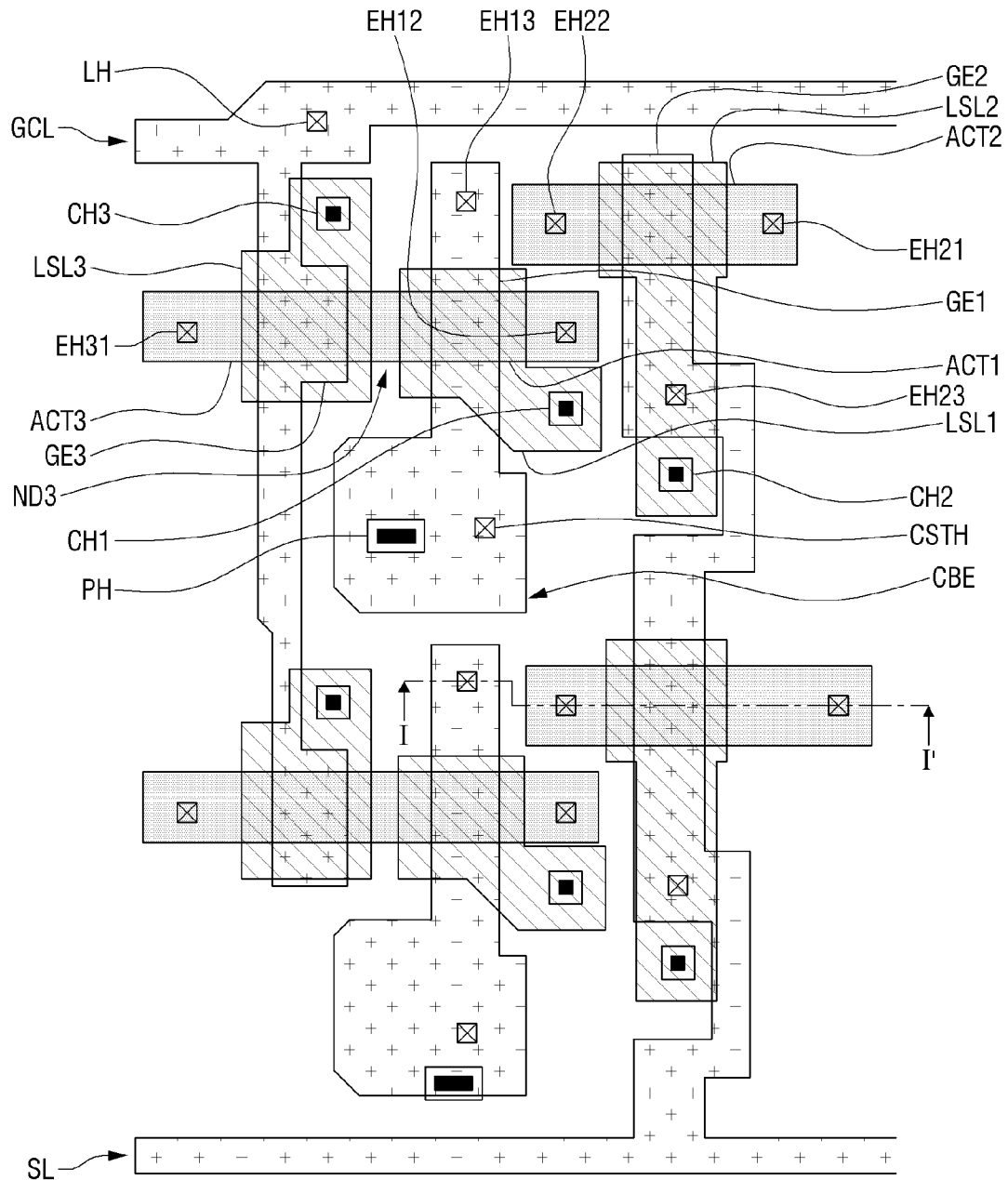
Figure 33:
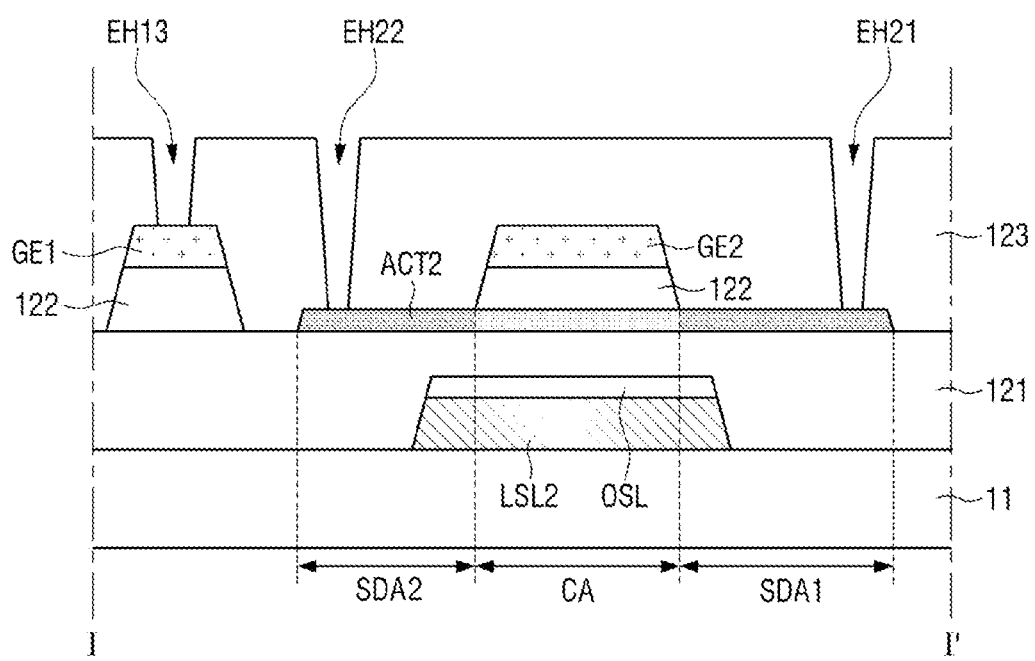

Referring to FIG. 32 and FIG. 33, the process S60 of patterning the interlayer insulating layer 123 and the buffer layer 121 to form each of the first electrode holes EH21, EH31, EH12, and EH22 and each of the contact holes CH1, CH2, and CH3 is performed.

In an embodiment, the first electrode holes EH21, EH31, EH12, and EH22 may include each of the source electrode holes EH21, and EH31, or each of the drain electrode holes EH12, and EH22 that formed through the interlayer insulating layer 123 to overlap or expose a portion of each of the active layers ACT1, ACT2, and ACT3.

In an embodiment, each of the contact holes CH1, CH2, and CH3 is formed through the interlayer insulating layer 123 and the buffer layer 121, to overlap or expose a portion of the oxygen supply layer OSL.

In an embodiment, the gate electrode holes EH13 and EH23 defined through the interlayer insulating layer 123 to overlap or expose portions of the gate electrodes GE1 and GE2, respectively may be formed at the same time in the process S60 of forming the first electrode holes EH21, EH31, EH12, and EH22 and the contact holes CH1, CH2, and CH3.

In an embodiment, the formation of the first electrode holes EH21, EH31, EH12, and EH22 and the formation of the contact holes CH1, CH2, and CH3 may be performed in different mask processes.

Alternatively, the first electrode holes EH21, EH31, EH12, and EH22 and the contact holes CH1, CH2, and CH3 may be simultaneously formed in a same mask process to reduce the number of mask processes. In such an embodiment, depending on a thickness of the buffer layer 121, a portion of each of the active layers ACT1, ACT2, and ACT3 exposed through each of the first electrode holes EH21, EH31, EH12, and EH22 may be damaged.

Figure 34:
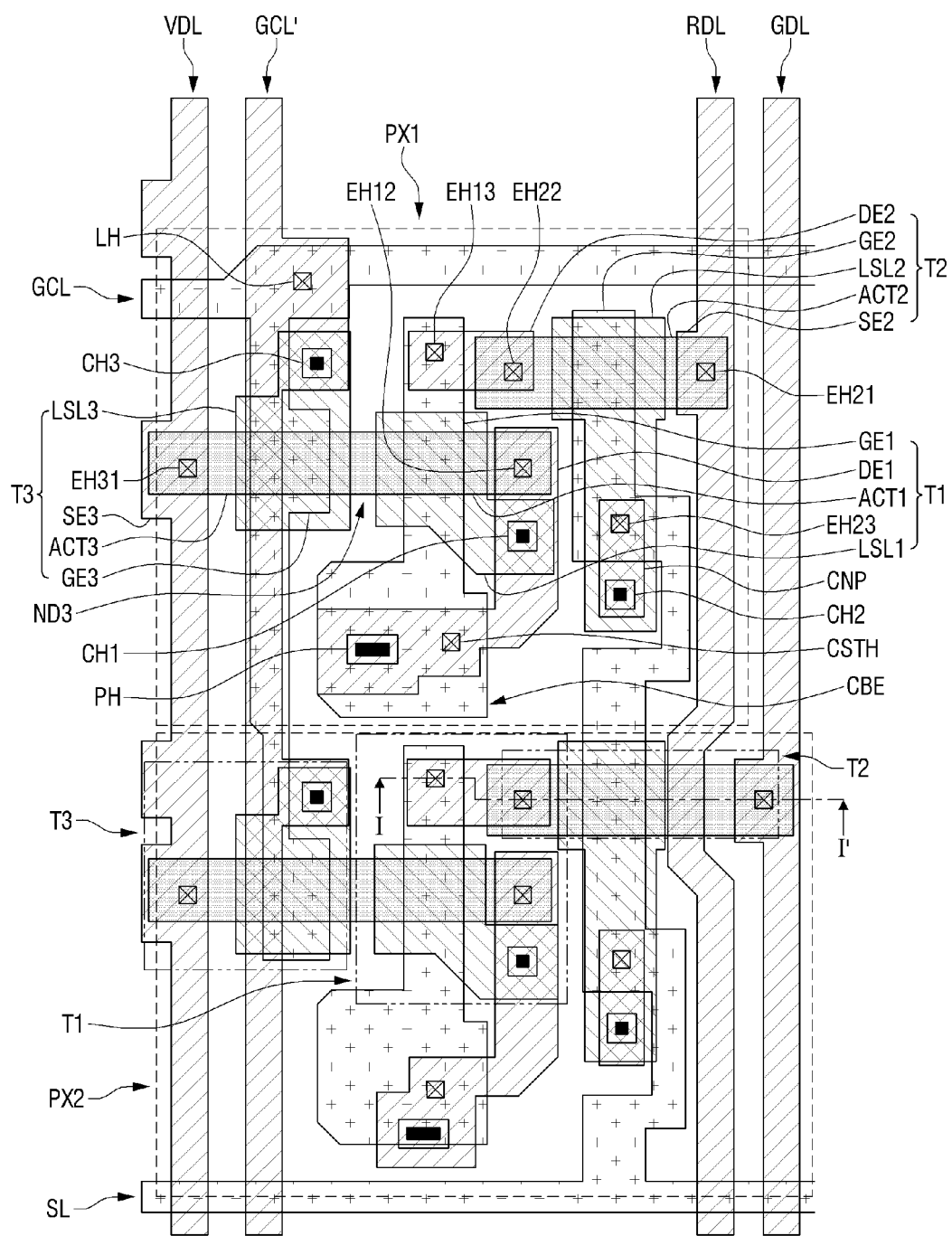
Figure 35:
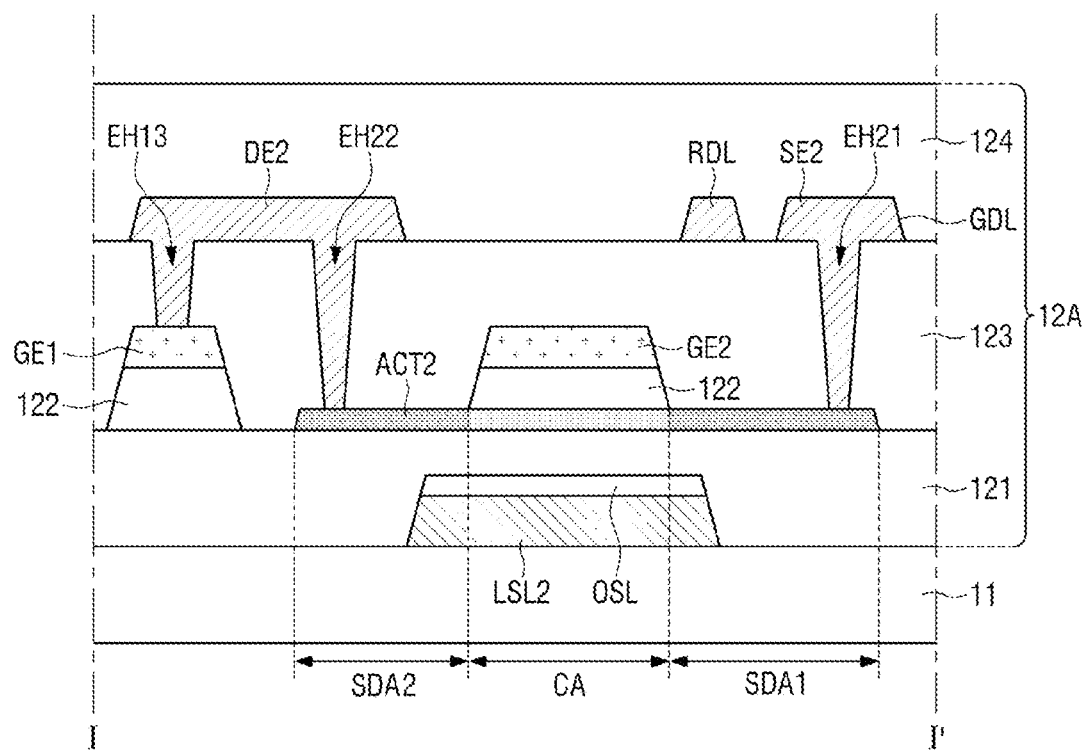

Referring to FIG. 34 and FIG. 35, the process S70 of patterning the second conductive material film (not shown) on the interlayer insulating layer 123 to form each of the first electrodes DE1, SE2, DE2, and SE3 is performed.

In an embodiment, the first electrodes DE1, SE2, DE2, and SE3 may include each of the source electrodes SE2 and SE3 or each of the drain electrodes DE1 and DE2 connected to each of the active layers ACT1, ACT2, and ACT3 via each of the first electrode holes EH21, EH31, EH12, and EH22.

In an embodiment, as the first electrode, the drain electrode DE1 of the first thin-film transistor T1 may be connected to the drain area SDA2 of the active layer ACT1 via the drain electrode hole EH12, and may be connected to the light-shielding layer LSL1 via the contact hole CH1 and the oxygen supply layer OSL.

The connective pattern CNP of the second thin-film transistor T2 may be formed at the same time in the process S70 of forming the first electrodes DE1, SE2, DE2, and SE3. In an embodiment, the connective pattern CNP may be connected to the gate electrode GE2 of the second thin-film transistor T2 via the gate electrode hole EH23 of the second thin-film transistor T2 formed through the interlayer insulating layer 123 and may be connected to the light-shielding layer LSL2 via the contact hole CH2 formed through the interlayer insulating layer 123 and the buffer layer 121 and the oxygen supply layer OSL. In such an embodiment, the light-shielding layer LSL2 of the second thin-film transistor T2 may be connected to the gate electrode GE2 via the connective pattern CNP and thus may function as the auxiliary gate electrode.

Although not shown separately, an embodiment of the method for manufacturing the thin-film transistor of FIG. 13 is the same as the embodiment of the method for manufacturing the thin-film transistor of FIG. 10 described above, except that in the process S40 of forming the gate insulating layer 122 and the gate electrodes GE1, GE2, GE3 further includes patterning an additional metal oxide material film (not shown) disposed between the insulating material film (203 in FIG. 29) and the first conductive material film (204 in FIG. 29) together with the insulating material film (203 in FIG. 29) and the first conductive material film (204 in FIG. 29) to form the auxiliary oxygen supply layer (SOSL of FIG. 13, FIG. 14, and FIG. 15) disposed between the gate insulating layer 122 and each of the gate electrodes GE1, GE2, and GE3. Thus, any repetitive detailed descriptions thereof will be omitted.

Figure 36:
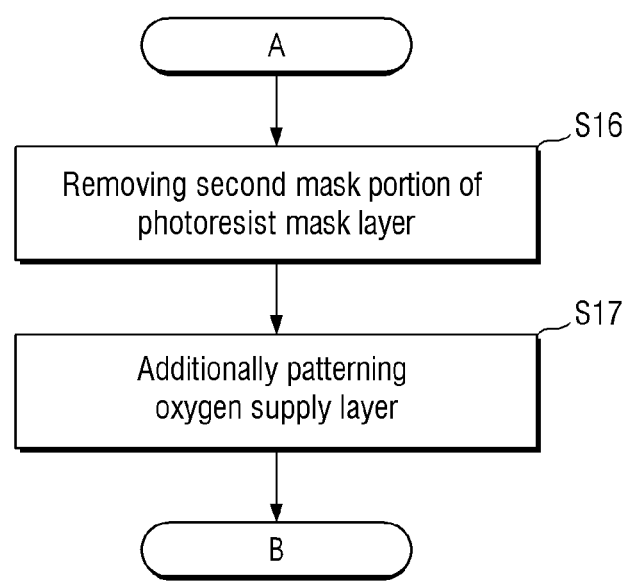
FIG. 36 and FIG. 37 are flowcharts showing a method for manufacturing a thin-film transistor according to an alternative embodiment.
Figure 37:
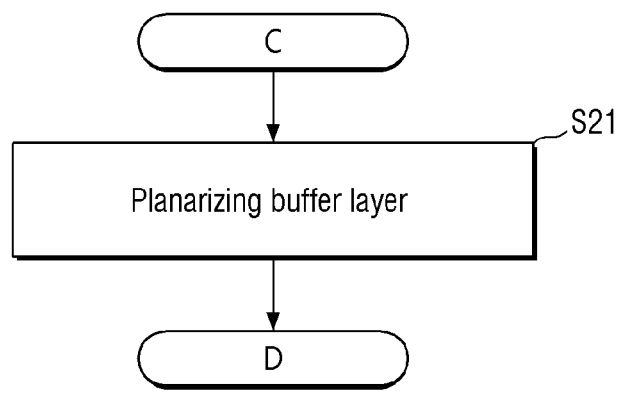

FIG. 36 and FIG. 37 are flowcharts showing a method for manufacturing the thin-film transistor according to an alternative embodiment. FIG. 38, FIG. 39, FIG. 40, FIG. 41, FIG. 42, FIG. 43 and FIG. 44 are cross-sectional views showing processes of FIG. 36 and FIG. 37. More particularly, FIG. 36 and FIG. 37 are flowcharts showing an embodiment of a method for manufacturing a thin-film transistor of FIG. 8, FIG. 16 and FIG. 17.

Referring to FIG. 36 and FIG. 37, an alternative embodiment of the method for manufacturing the thin-film transistor is the same as the embodiment of the method for manufacturing the thin-film transistor of FIG. 18 and FIG. 19 except that a photoresist mask layer including first and second mask portions of different thicknesses is used in the process S12 of disposing the photoresist mask layer of FIG. 18, and the method further includes a process S16 of removing the second mask portion of the photoresist mask layer and a process S17 of additionally patterning the oxygen supply layer OSL between the process S14 of forming the light-shielding layer of FIG. 18 and the process S15 of removing the photoresist mask layer of FIG. 19, and the method further includes a process S21 of planarizing the buffer layer after the process S20 of forming the buffer layer of FIG. 19. Thus, any repetitive detailed descriptions of the same or like elements thereof as those described above will hereinafter be omitted.

Figure 38:
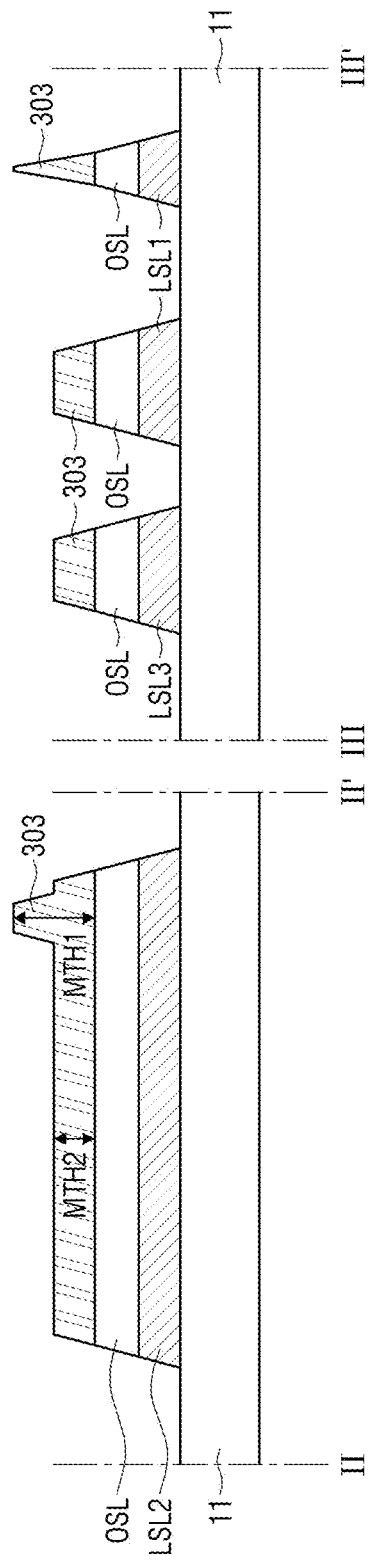
FIG. 38, FIG. 39, FIG. 40, FIG. 41, FIG. 42, FIG. 43 and FIG. 44 are cross-sectional views showing processes of FIG. 36 and FIG. 37.

Referring to FIG. 38, in the process S12 of forming the photoresist mask layer 303, a photoresist mask layer 303 includes the first mask portion of a first mask thickness MTH1, and the second mask portion of a second mask thickness MTH2 smaller than the first mask thickness MTH1. In an embodiment, for example, the photoresist mask layer 303 including the first and second mask portions may be embodied as a halftone exposure mask.

In such an embodiment, the first mask portion of the first mask thickness MTH1 corresponds to the contact holes CH1, CH2, and CH3 to be described later.

Figure 39:
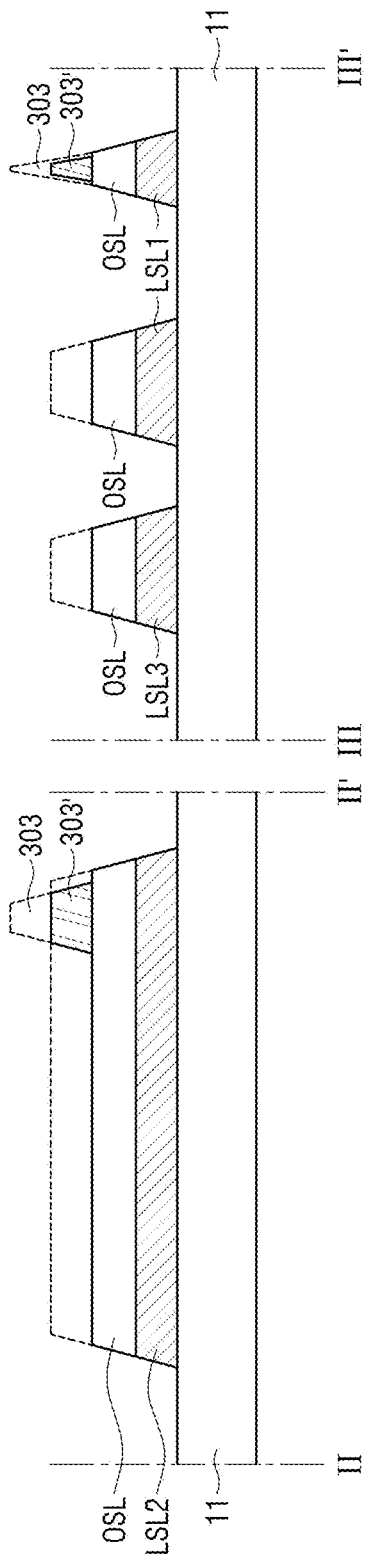

Referring to FIG. 39, after the processes S13 and S14 of preparing each of the light-shielding layers LSL1, LSL2, and LSL3 and the oxygen supply layer OSL using the photoresist mask layer 303, the process S16 of removing the second mask portion of the mask thickness MTH2 from the photoresist mask layer 303 is performed. In an embodiment, for example, the process S16 of removing the second mask portion may be performed by performing an ashing process on the photoresist mask layer 303.

Accordingly, the second mask portion is removed from the photoresist mask layer 303, and a first mask portion 303' having a thickness smaller than the first mask thickness MTH1 remains.

Figure 40:
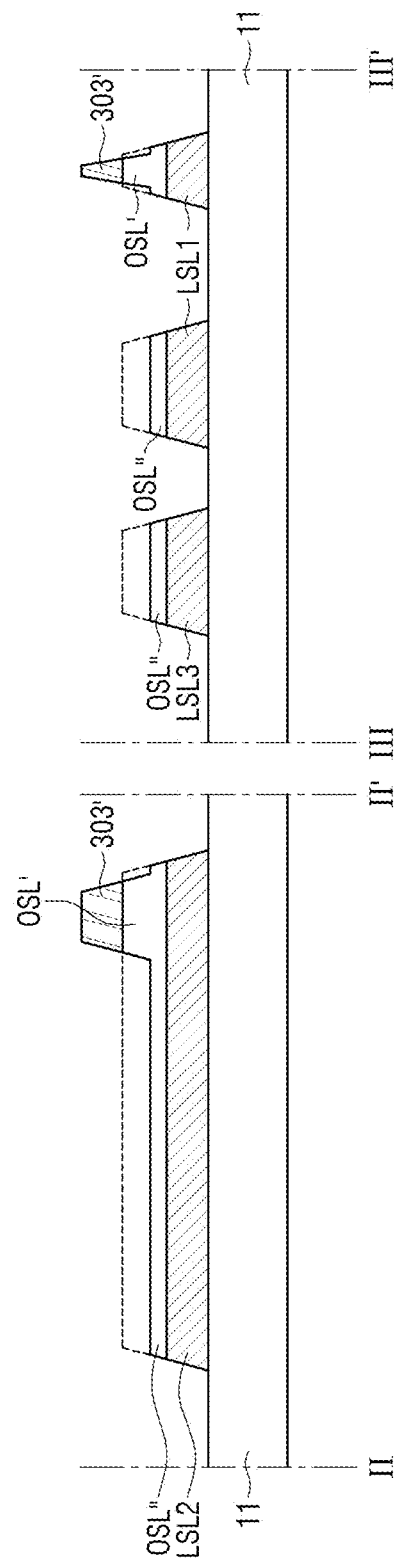

Referring to FIG. 40, the process S17 of additionally patterning the oxygen supply layer (OSL in FIG. 39) based on the remaining first mask portion 303' is performed.

In such an embodiment, the portion OSL' of the oxygen supply layer corresponding to the first mask portion 303' is not patterned and thus has a first thickness TH. The other portion OSL" thereof is patterned and thus has a second thickness TH2 smaller than the first thickness TH1.

Figure 41:
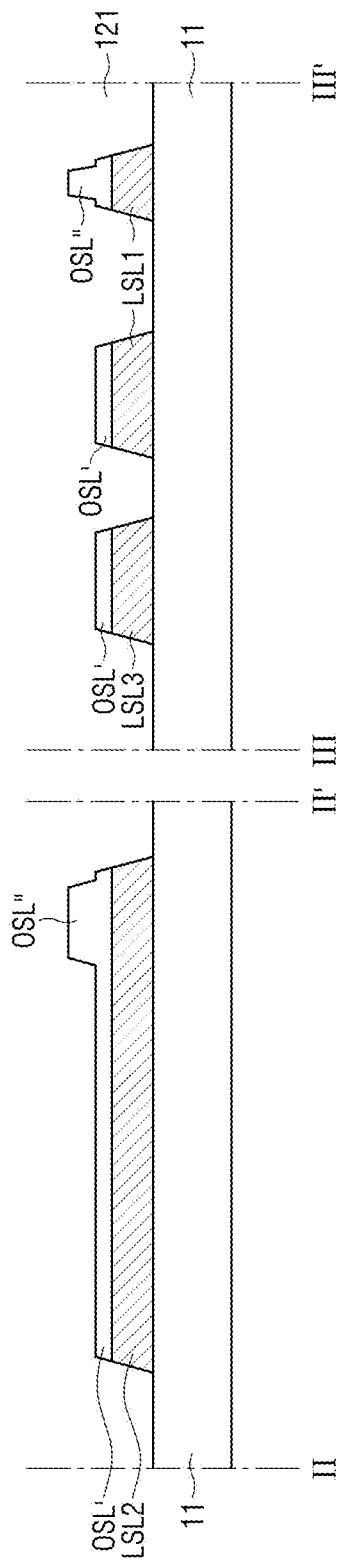

Referring to FIG. 41, after the oxygen supply layer OSL' of the first thickness TH1 and the oxygen supply layer OSL" of the second thickness TH2 are prepared, the process S15 of removing the first mask portion 303' is performed.

Figure 42:
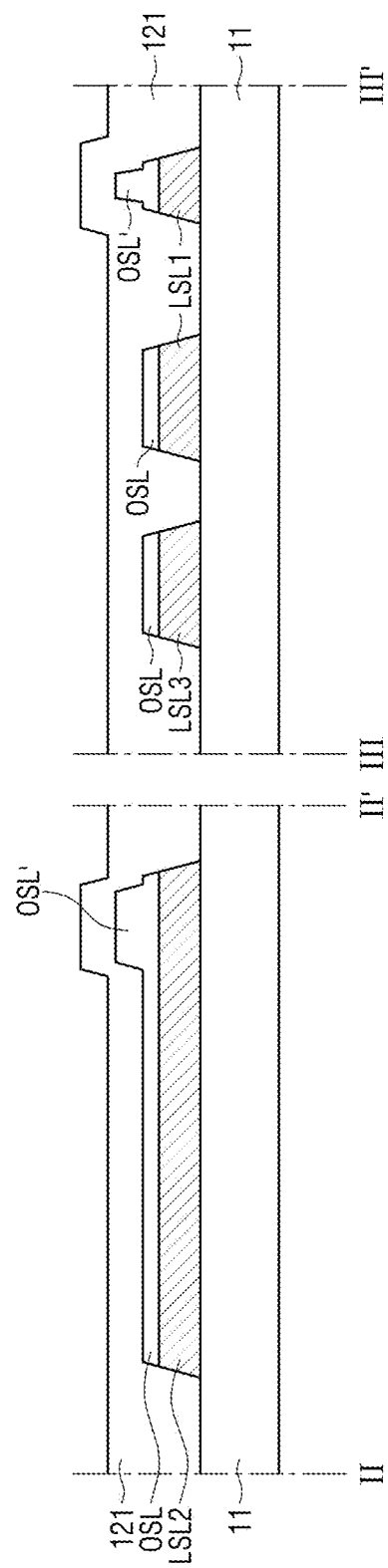

Referring to FIG. 42, the process S20 of applying the insulating material film on the substrate 11 to form the buffer layer 121 covering the oxygen supply layer OSL' of the first thickness TH1 and the oxygen supply layer OSL" of the second thickness TH2 is performed.

In an embodiment, the buffer layer 121 has a shape including a convex portion corresponding to the oxygen supply layer OSL' of the first thickness TH1.

Figure 43:
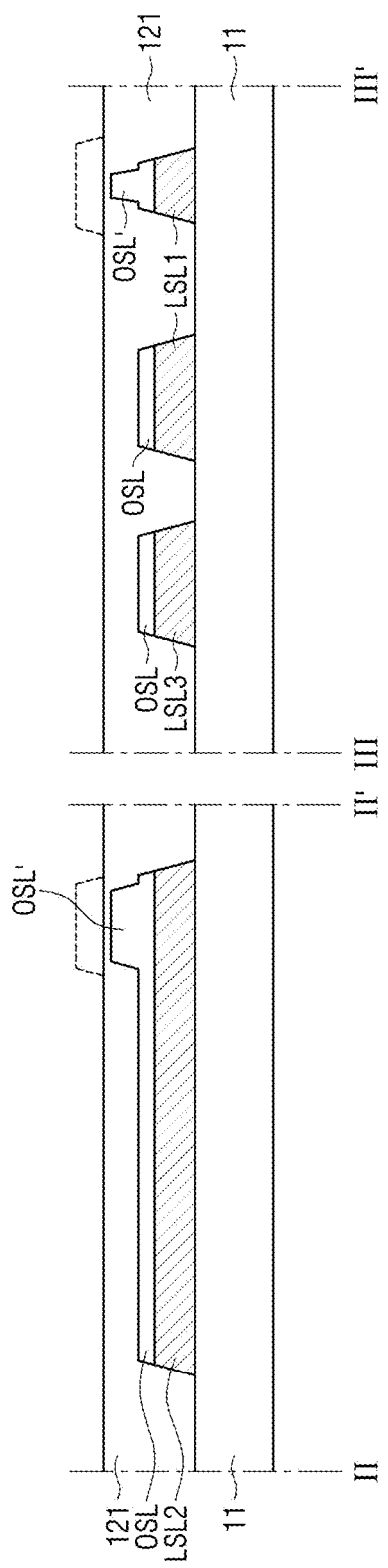

Referring to FIG. 43, a process S21 of planarizing the buffer layer 121 is performed.

In an embodiment, a portion of the buffer layer 121 in contact with the substrate 11 has a third thickness TH3, while the other portion thereof covering the oxygen supply layer OSL' of the first thickness TH1 has a fourth thickness TH4 smaller than the third thickness TH3.

The third thickness TH3 exceeds the sum of the thickness of each of the light-shielding layers LSL1, LSL2, and LSL3 and the first thickness TH1 of the oxygen supply layer OSL'. Accordingly, the oxygen supply layer OSL' of the first thickness TH1 may also be covered with the buffer layer 121.

Figure 44:
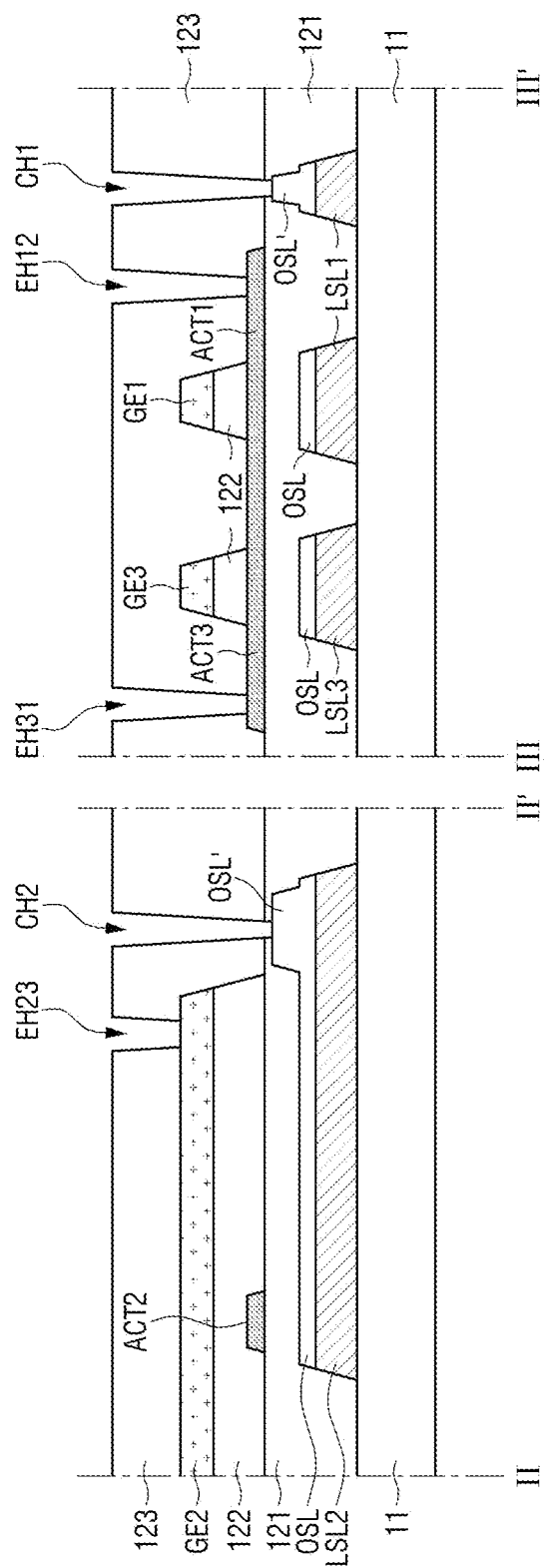

Referring to FIG. 44, in the process S60 of forming the first electrode holes EH21, EH31, EH12, and EH22 and the contact holes CH1, CH2, and CH3, the first electrode holes EH21, EH31, EH12, and EH22 and the contact holes CH1, CH2, and CH3 may be performed simultaneously in a same mask process.

In an embodiment, a portion of each of the active layers ACT1, ACT2, and ACT3 exposed to each of the first electrode holes EH21, EH31, EH12, and EH22 is exposed to etching until each of the contact holes CH1, CH2, and CH3 is formed. That is, as the fourth thickness TH4 of the buffer layer 121 is larger, the portion of each of the active layers ACT1, ACT2, and ACT3 exposed to each of the first electrode holes EH21, EH31, EH12, and EH22 may be damaged due to excessive etching.

Accordingly, the fourth thickness TH4 of the buffer layer 121 may be set to a value in a range such that each of the active layers ACT1, ACT2, and ACT3 is not damaged due to the etching in the process S60 of forming each of the contact holes CH1, CH2, and CH3.

In an embodiment, for example, the sum of the fourth thickness TH4 and the thicknesses of each of the active layers ACT1, ACT2, and ACT3 may be about 300 Å or smaller.

As described above, according to an embodiment, the portion of the buffer layer 121 corresponding to each of the contact holes CH1, CH2, and CH3 is formed to have the relatively smaller fourth thickness TH4, using the oxygen supply layer OSL' and OSL" provided to supply the oxygen to each of the active layers ACT1, ACT2, and ACT3. Accordingly, while each of the first electrode holes EH21, EH31, EH12, and EH22, and each of the contact holes CH1, CH2, and CH3 are formed in a same mask process such that the number of mask processes is reduced, a time duration for which each of the active layers ACT1, ACT2, and ACT3 is exposed to the etching process until each of the contact holes CH1, CH2, and CH3 is formed may be reduced, thereby preventing the damage to each of the active layers ACT1, ACT2, and ACT3. Accordingly, the manufacturing process of the thin-film transistor may be simplified, and at the same time, deterioration of the characteristics of the thin-film transistor may be effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A thin-film transistor comprising:
   a light-shielding layer disposed on a substrate;
   an oxygen supply layer disposed on the light-shielding layer, wherein the oxygen supply layer includes a metal oxide, and the light-shielding layer and the oxygen supply layer have a same patterned shape as each other in a plan view;
   a buffer layer disposed on the substrate and covering the oxygen supply layer;
   an active layer disposed on the buffer layer, wherein the active layer includes a channel area overlapping the light-shielding layer, and a first electrode area and a second electrode area respectively in contact with opposing sides of the channel area;
   a gate insulating layer disposed on the channel area of the active layer;
   a gate electrode disposed on the gate insulating layer;
   an interlayer insulating layer disposed on the buffer layer and covering the active layer and the gate electrode, wherein a first electrode hole is defined through the interlayer insulating layer to overlap a portion of the first electrode area of the active layer; and
   a first electrode disposed on the interlayer insulating layer and connected to the first electrode area of the active layer via the first electrode hole.

2. The thin-film transistor of claim 1, wherein a contact hole is defined through the interlayer insulating layer and the buffer layer to overlap a portion of the oxygen supply layer,
   wherein the light-shielding layer is connected to one of the gate electrode and the first electrode via the contact hole and the oxygen supply layer.

3. The thin-film transistor of claim 2, wherein a portion of the oxygen supply layer corresponding to the contact hole has a first thickness, and another portion of the oxygen supply layer has a second thickness smaller than the first thickness.

4. The thin-film transistor of claim 3,
   wherein the buffer layer is disposed directly on the substrate and has a planarized top surface,
   wherein a portion of the buffer layer in contact with the substrate has a third thickness,
   wherein the third thickness of the portion of the buffer layer exceeds a sum of the first thickness of the portion of the oxygen supply layer and a thickness of the light-shielding layer.

5. The thin-film transistor of claim 4, wherein a difference between a depth of the first electrode hole and a depth of the contact hole is about 300 Å or smaller.

6. The thin-film transistor of claim 1, wherein the metal oxide includes at least one selected from indium (In), gallium (Ga), zinc (Zn), tin (Sn), titanium (Ti), zirconium (Zr), and hafnium (Hf).

7. The thin-film transistor of claim 1, wherein the active layer includes an oxide semiconductor including at least one selected from indium (In), gallium (Ga), zinc (Zn), tin (Sn), titanium (Ti), zirconium (Zr), and hafnium (Hf).

8. The thin-film transistor of claim 7, wherein each of the active layer and the oxygen supply layer includes indium-gallium-zinc-oxide.

9. The thin-film transistor of claim 1, further comprising:
   an auxiliary oxygen supply layer disposed between the gate insulating layer and the gate electrode, wherein the auxiliary oxygen supply layer includes the metal oxide.

10. The thin-film transistor of claim 1, further comprising:
    a second electrode disposed on the interlayer insulating layer and connected to the second electrode area of the active layer via a second electrode hole defined through the interlayer insulating layer to overlap a portion of the second electrode area of the active layer.

11. A thin-film transistor array substrate comprising:
    a substrate including a display area in which a plurality of pixel areas are defined;
    a scan line disposed on the display area of the substrate, and extending in a first direction; and
    a data line disposed on the display area of the substrate, and extending in a second direction,
    wherein each of the plurality of pixel areas includes:
    a first thin-film transistor disposed between a first drive power line and a pixel electrode; and
    a second thin-film transistor disposed between a gate electrode of the first thin-film transistor and the data line, and connected to the scan line,
    wherein at least one selected from the first thin-film transistor and the second thin-film transistor includes:
    a light-shielding layer disposed on the substrate;
    an oxygen supply layer disposed on the light-shielding layer, wherein the light-shielding layer and the oxygen supply layer have a same patterned shape as each other in a plan view;
    an active layer disposed on a buffer layer covering the oxygen supply layer, wherein the active layer includes a channel area overlapping the light-shielding layer, and first and second electrode areas respectively in contact with opposing sides of the channel area;
    a gate insulating layer disposed on the channel area of the active layer;
    a gate electrode disposed on the gate insulating layer; and
    a first electrode disposed on an interlayer insulating layer covering the active layer and the gate electrode, wherein the first electrode is connected to the first electrode area of the active layer via a first electrode hole defined through the interlayer insulating layer.

12. The thin-film transistor array substrate of claim 11, wherein the oxygen supply layer includes a metal oxide including at least one selected from indium (In), gallium (Ga), zinc (Zn), tin (Sn), titanium (Ti), zirconium (Zr), and hafnium (Hf).

13. The thin-film transistor array substrate of claim 11, wherein the active layer includes an oxide semiconductor including at least one selected from indium (In), gallium (Ga), zinc (Zn), tin (Sn), titanium (Ti), zirconium (Zr), and hafnium (Hf).

14. The thin-film transistor array substrate of claim 11, wherein the light-shielding layer is connected to one of the gate electrode and the first electrode via a contact hole defined through the interlayer insulating layer and the buffer layer to overlap a portion of the oxygen supply layer.

15. The thin-film transistor array substrate of claim 14, wherein the second electrode area of the active layer of the first thin-film transistor is connected to the first drive power line,
- wherein the first electrode of the first thin-film transistor is connected to the light-shielding layer via the contact hole.

16. The thin-film transistor array substrate of claim 14, wherein the second thin-film transistor further includes:
- a second electrode disposed on the interlayer insulating layer and connected to the second electrode area of the active layer via a second electrode hole defined through the interlayer insulating layer to overlap a portion of the second electrode area of the active layer,
- wherein a third electrode hole is defined through the interlayer insulating layer to overlap a portion of the gate electrode of the first thin-film transistor,
- wherein the first electrode of the second thin-film transistor is connected to the data line,
- wherein the second electrode of the second thin-film transistor is connected to the gate electrode of the first thin-film transistor via the third electrode hole.

17. The thin-film transistor array substrate of claim 14, wherein
- a third electrode hole is defined through the interlayer insulating layer to overlap a portion of the gate electrode of the second thin-film transistor,
- a connective pattern is disposed on the interlayer insulating layer and connects the contact hole and the third electrode hole to each other,
- wherein the gate electrode of the second thin-film transistor is connected to the light-shielding layer of the second thin-film transistor via the third electrode hole, the contact hole, and the connective pattern.

18. The thin-film transistor array substrate of claim 14, wherein a portion of the oxygen supply layer corresponding to the contact hole has a first thickness, and another portion of the oxygen supply layer has a second thickness smaller than the first thickness.

19. The thin-film transistor array substrate of claim 18, wherein a portion of the buffer layer in contact with the substrate has a third thickness,
- wherein the third thickness of the portion of the buffer layer is greater than a sum of the first thickness of the portion of the oxygen supply layer and a thickness of the light-shielding layer.

20. The thin-film transistor array substrate of claim 19, wherein a difference between a depth of the first electrode hole and a depth of the contact hole is about 300 Å or smaller.

21. The thin-film transistor array substrate of claim 11, wherein at least one selected from the first thin-film transistor and the second thin-film transistor further includes an auxiliary oxygen supply layer disposed between the gate insulating layer and the gate electrode,
- wherein the auxiliary oxygen supply layer includes a metal oxide.

* * * * *